United States Patent [19]

Sawada et al.

[11] Patent Number: 5,232,634
[45] Date of Patent: Aug. 3, 1993

[54] COLOR FILTER FOR MULTI-COLOR LIQUID-CRYSTAL DISPLAY PANEL AND PROCESS OF FABRICATING SUCH COLOR FILTERS

[75] Inventors: Toyoaki Sawada; Hisao Hoshi; Hiroki Endo; Mizuhiro Tani; Makoto Sakagawa; Takeo Sugiura; Masaji Yonezawa, all of Saitama, Japan

[73] Assignee: Toppan Printing Co., Ltd., Tokyo, Japan

[21] Appl. No.: 440,855

[22] Filed: Nov. 24, 1989

[30] Foreign Application Priority Data

| Nov. 26, 1988 | [JP] | Japan | 63-299245 |
| Jan. 6, 1989 | [JP] | Japan | 1-1018 |
| Jan. 30, 1989 | [JP] | Japan | 1-20156 |
| Jan. 30, 1989 | [JP] | Japan | 1-20157 |
| Jul. 20, 1989 | [JP] | Japan | 1-188625 |

[51] Int. Cl.⁵ ............ G02B 5/20; G02F 1/13; F21V 9/04
[52] U.S. Cl. ............ 252/584; 252/589; 359/66; 359/68
[58] Field of Search ........ 252/584, 589; 350/311, 350/339 F; 359/66, 68

[56] References Cited

U.S. PATENT DOCUMENTS

| 4,262,072 | 4/1981 | Wendling et al. | 430/14 |
| 4,336,546 | 6/1982 | Edwards et al. | 346/74.7 |
| 4,597,637 | 7/1986 | Ohta et al. | 350/339 F |
| 4,639,088 | 1/1987 | Suginoya et al. | 350/339 F |
| 4,704,559 | 11/1987 | Suginoya et al. | 315/169.1 |
| 4,744,637 | 5/1988 | Sekimura et al. | 350/339 F |
| 4,786,148 | 11/1988 | Sekimura | 359/68 X |
| 4,818,075 | 4/1989 | Takao et al. | 350/339 F |
| 4,942,103 | 7/1990 | Reithel et al. | 430/7 |

FOREIGN PATENT DOCUMENTS 0763833 9/1980 Japan.
0247603 12/1985 Japan.

Primary Examiner—Robert L. Stoll
Assistant Examiner—C. Harris
Attorney, Agent, or Firm—Burns, Doane, Swecker & Mathis

[57] ABSTRACT

A color filter for use in a liquid-crystal display panel structure, including a transparent substrate having a surface portion, and a multiplicity of filter elements distributed in a predetermined pattern on the surface portion of the substrate, each of the filter elements being formed of a photosetting colored filter composition containing an acrylic resin, a coloring compound and a dispersant. In this color filter according to the present invention, the dispersant preferably includes a derivative of an organic colorant. A color filter according to the present invention may further include a transparent overcoat of a synthetic resin covering the filter elements.

35 Claims, 6 Drawing Sheets

COLOR FILTER FOR MULTI-COLOR LIQUID-CRYSTAL DISPLAY PANEL AND PROCESS OF FABRICATING SUCH COLOR FILTERS

FIELD OF THE INVENTION

The present invention relates in general to a liquid-crystal display panel structure and, particularly, to a multi-color liquid-crystal display panel structure. More particularly, the present invention relates to a color filter for use in a multi-color liquid-crystal display panel structure and further to a process of fabricating such a color filter. A liquid-crystal display panel structure to which the present invention generally appertains may be of any of the various types which per se are known in the art, such as a liquid-crystal display panel structure of the twisted-nematic (TN) type, the super-twisted-nematic (STN) type, the guest-host (GH) type, or the ferroelectric liquid crystal (FLC) type.

BACKGROUND OF THE INVENTION

Among the various requirements of color filters for use in multi-color liquid-crystal display devices are high degrees of heat resistance, color fastness or light resistance, and clarity or transmittance. The present invention has been completed on the basis of the Applicant's discovery that acryl resins in particular are useful to achieve high degrees of clarity and additionally excellent chemical resistance. The present invention is further based on the finding that, in respect of the heat resistance and color fastness, organic or inorganic pigments significantly excel dyestuffs in general and are for this reason useful for use in a color filter of a liquid-crystal display device. Thus, the present invention contemplates the use of acryl resins and an organic or inorganic pigment to form a color filter having high degrees of heat resistance, color fastness and clarity. The acryl resins to be used may be either in the form of polymers resulting from polymerization of a specific type of acryl monomers or in the form of copolymers resulting from copolymerization of two or more different types of acryl monomers.

A conventional color filter for a liquid-crystal panel generally uses a base material consisting of a naturally occurring, dyeable organic compound such as typically gelatin or casein purified and decomposed into fractions of smaller numbers of molecules (usually of $1 \times 10^4$ to $5 \times 10^4$ molecules). An aqueous solution of the dyeable organic compound, which is soluble in water, is applied to the surface of a transparent substrate for each of the colors to be used for the color filter. The layer of the compound thus formed on the surface of the transparent substrate is patterned to form a multiplicity of separate regions. The separate regions of the compound are then dyed with a dyestuff having a particular characteristic color and are thereafter baked to form discrete color filter elements for the particular color on the substrate. These process steps are repeated for the individual colors for use in the display panel until color filter elements arranged in a multiplicity of triads or any desired groups each consisting of a predetermined number of differently colored filter elements are formed on the surface of the substrate.

A color filter fabricated by this known method however has a drawback in that the organic compound to be dyed is a naturally occurring substance and is for this reason not fully acceptable in respect of the resistance to heat. The use of a dyestuff for imparting a color to the base material of the compound results in another drawback of the prior-art color filter which is not acceptable for its relatively low degree of color fastness of light resistance.

Whereas, various research and development efforts have thus far been directed at the use of pigments in substitution for dyestuffs in fabricating a color filter for a liquid-crystal display panel having excellent heat and light resistances. Pigments in general have however been considered to be unsuited for forming color filters of liquid-crystal display panels having uniform transmittance and excellent color fastness. This is particularly by reason of the relatively low degree of dispersibility of pigments in general.

As well known in the art, the layer of the color elements is sandwiched between the transparent substrate and a transparent electrode to activate the liquid crystals. A thin orientation of typically polyimide resin is formed on this transparent electrode and is baked at high temperature. The layer of the color filter elements is required to withstand the temperature transmitted through the transparent electrode from the orientation film.

On the other hand, liquid-crystal display devices are often used outdoors or installed on automotive vehicles and are thus frequently subjected to solar radiation. The color filters for use in such display devices are required to have sufficiently high degrees of light resistance or color fastness.

Another important requirement of a color filter for use in a liquid-crystal display panel is that the filter elements forming the payer of the color filter has clear-cut contours on the transparent substrate. For this purpose, it is desirable to use a photosetting substance as the colored filter composition of a color filter for a multi-color liquid-crystal display panel structure. A chemical composition having a photosetting property is caused to set when exposed to light and is thus useful for defining filter elements with clear-cut contours in a multi-color liquid-crystal display panel.

SUMMARY OF THE INVENTION

It is, accordingly, an important object of the present invention to provide an improved color filter having high degrees of heat and light resistances and using a coloring compound having an excellent dispersibility providing a high degree of light transmissivity in a liquid-crystal display panel structure.

It is thus another important object of the present invention to provide an improved color filter which is particularly useful in a liquid-crystal display device which may be subjected to high temperatures during fabrication and may be used under exacting environmental circumstances.

It is still another important object of the present invention to provide an improved color filter formed by a color filter composition having a photosetting property and thus capable of forming color filter elements with sufficiently clear-cut contours.

It is still another important object of the present invention to provide a process of fabricating such a color filter for a multi-color liquid-crystal display panel structure.

While the advantages of a color filter according to the present invention will be best exploited in color filters for a multi-color liquid-crystal display panel structure, it will be apparent that the present invention is applicable to color filters of a uni-color liquid-crystal display panel structure.

In accordance with a first outstanding of the present invention, there is provided a color filter for use in a liquid-crystal display panel structure, comprising a) a transparent substrate having a surface portion, and b) a multiplicity of filter elements distributed in a predetermined pattern on the surface portion of the substrate, each of the filter elements being formed of a photosetting colored filter composition containing an acrylic resin, a coloring compound and a dispersant. In this color filter according to the present invention, the dispersant preferably comprises a derivative of an organic colorant. A color filter according to the present invention may further comprise a transparent overcoat of a synthetic resin covering the filter elements.

In a color filter according to the present invention, in which the acrylic resin comprises structural units selected from the group expressed by the general formula:

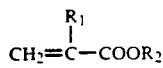

wherein $R_1$ represents a hydrogen atom or a methyl group and $R_2$ represents an alkyl, an isoalkyl group, a phenyl group, a cyclohexyl group, or a tetrahydrofurfuryl group.

In accordance with a second outstanding of the present invention, there is provided a process of preparing a color filter for use in a liquid-crystal display panel structure, comprising the steps of a) mixing and dissolving monomers of an acrylic resin, a coloring compound and a dispersant in a solvent, b) adding a photosetting substance to the resultant solution to produce a photosetting colored filter composition, c) forming a layer of the colored filter composition on the surface of a transparent substrate, d) selectively exposing the layer to light and developing the resultant layer for forming a multiplicity of discrete filter regions of photoset colored filter composition distributed in a desired pattern on the surface of the substrate. The photosetting substance may comprise either a photosensitive cross-linking compound or a photopolymerization initiator and acryl monomers.

BRIEF DESCRIPTION OF THE ACCOMPANYING DRAWINGS

The features and advantages of a color filter according to the present invention and a process of fabricating such a color filter in accordance with the present invention will be more clearly understood from the following description taken in conjunction with the accompanying drawings in which.

PREFERRED EMBODIMENTS OF THE INVENTION

Figure 1:
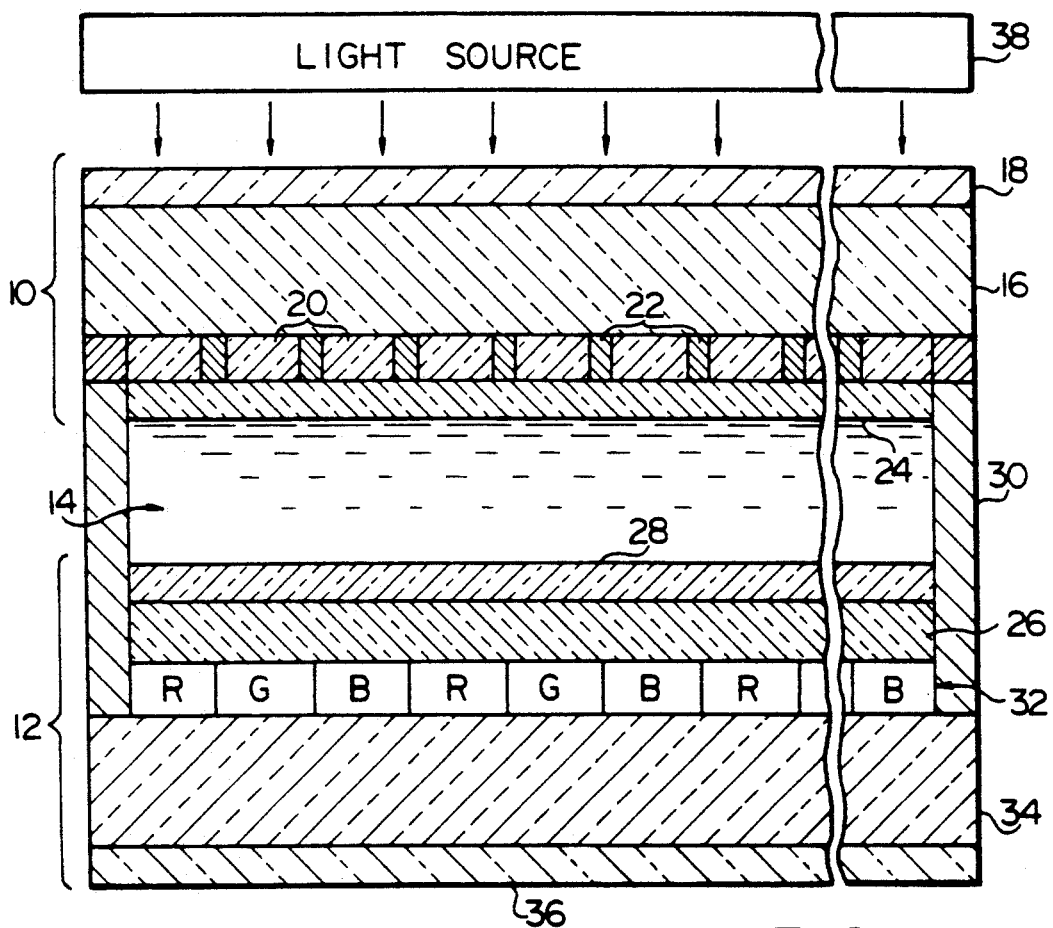
FIG. 1 is a fragmentary cross sectional view showing the configuration of a typical example of a multi-color liquid-crystal display panel structure of the type to which the present invention generally appertains.

Referring to FIG. 1, a multi-color liquid-crystal display panel structure to which the present invention generally appertains largely consists of an active-matrix assembly 10, and a common electrode assembly 12, and a layer of liquid crystals 14 sandwiched between the active-matrix and common electrode assemblies 10 and 12. The liquid crystal layer 14 is herein assumed to be of the twisted nematic (TN) type by way of example.

The active-matrix assembly 10 comprises a first transparent substrate 16 and a first linear polarizer film 18 attached to the outer face of the substrate 16. The first substrate 16 is typically formed of glass or any transparent plate or film of a synthetic resin. On the inner face of the first substrate 16 is provided an active layer formed by a multiplicity of transparent pixel electrodes 20 and semiconductor switching devices 22 typically implemented by thin-film field-effect transistors. The pixel electrodes 20 are respectively associated with the individual switching devices 20 to form a multiplicity of pixel elements arranged in rows and columns in the active layer. To the face of the active layer opposite to the active-matrix substrate 16 is attached a first orientation film 24 of, typically silane. In the active layer are further included conductor strips forming signal and scanning lines electrically connected to the pixel electrodes 20 and semiconductor switching devices 22, though not shown in the drawings.

On the other hand, the common electrode assembly of the liquid-crystal display panel structure comprises a transparent common electrode 26 and a second orientation film 28 attached to the inner face of the electrode 26. The layer of liquid crystals 14 is sandwiched between the first and second orientation films 24 and 28 and is hermetically sealed off by a layer of sealant 30 as shown. On the face of the common electrode 26 opposite to the second orientation film 28 is provided an two-dimensional, mosaic array of color filter elements 32 arranged in registry with the pixel electrodes 20, respectively. The array of the color filter elements 32 is interposed between the common electrode 26 and a second transparent substrate 34 having a second linear polarizer film 36 attached to the outer face of the substrate 34. The second substrate 34 is also typically formed of glass or any transparent plate or film of a synthetic resin.

In proximity to the first linear polarizer film 18 is positioned a source of parallel white light which is implemented by an illuminating device 38 such as for example a fluorescent lamp. Thus, the white light emanating from the illuminating device 38 and incident on the liquid-crystal display panel structure is transmitted through the first linear polarizer film 18, first substrate 16 and the active layer formed by the transparent pixel electrodes 20 and semiconductor switching devices 22. The light then passes through the first orientation film 24 and is admitted into the liquid crystal layer 14. Past the liquid crystal layer 14, the light is transmitted through the second orientation film 28 and transparent common electrode 26 into the array of color filter elements 32 and is decomposed into three-color components. The three-color components of the light are passed through the second substrate 34 and second linear polarizer film 36 and are perceived as a multicolor image by the viewer of the display device.

The liquid crystals forming the liquid crystal layer 14 between the first and second orientation films 24 and 28 are oriented responsive to a signal voltage developed between the common electrode 26 and selected ones of the pixel electrodes 20. Thus, the combination of the liquid crystal layer 14 and the first and second orientation films 24 and 28 provides two-dimensional array of light shutter elements by means of which the light admitted into the panel structure is passed only to selected ones of the color filter elements 32.

The array of the color filter elements 32 is provided between the transparent common electrode 26 and the second transparent substrate 34 in the shown multicolor liquid-crystal display panel structure. If desired, however, the array of the color filter elements 32 may be formed between the second orientation film 28 and the common electrode 26 with the second substrate 34 directly attached to the common electrode 26, though not shown.

The color filter elements 32 are arranged in a multiplicity of triads each consisting of three color filter elements respectively assigned to the three primary colors of, typically, red (R), green (G) and blue (B) as shown. By preference, black or otherwise opaque films may be provided to intervene between these color filter elements 32 for forming light shielding elements between the individual filter elements 32. Each of the color filter elements 32 is located in registry with each of the pixel electrodes 20. In addition, each color filter element 32 is similar in shape to each of the pixel electrodes 20 and is square shaped with each of its sides sized several millimeters in a panel structure for use in a large-sized display device or tens of microns to hundreds of microns in a panel structure for use in a handy-type display device.

A color filter provided by the present invention may be implemented by each of the red-, green- and blue-color filter elements 32 which are arranged as hereinbefore described and comprises a colored filter composition containing, as its major components, an acrylic resin, a red, green, blue or other coloring compound, and a dispersant.

The acrylic resin component of the colored filter composition lends itself to fixing the coloring compound onto the surface of the second substrate 34 of, typically, glass while allowing the coloring compound to be distributed in a desired pattern on the substrate 34. The acrylic resin component of the filter composition further acts as a support material allowing formation of the common electrode 26 on the layer of the color filter elements 32.

The coloring compound in the filter composition plays the role of decomposing white light into a single-colored component characteristic of the particular coloring compound and is for this reason required to have adequate degrees of clarity, light resistance (color fastness) and heat resistance. Preferred as the coloring compound having a high degree of clarity is any of known organic pigments. The coloring compound for use in the colored filter composition forming a color filter according to the present invention is further required to have a linear molecular size which is sufficiently small compared to the range of the wavelengths of visible light and which is thus preferably less than 0.3 micron or, more preferably, less than 0.1 micron. The pigment may be substituted by a dyestuff but is preferred over a dyestuff for its heat and light resistances that excel those of dyestuffs.

On the other hand, the dispersant for use in the colored filter composition of a color filter according to the present invention serves to preclude condensation of the coloring compound and enable the coloring compound to be uniformly distributed in the acrylic resin. The dispersant is thus also required to have an adequate degree of heat resistance and should be selected not to impair the various mechanical and chemical properties and characteristics of the color filter. Tests and experiments have revealed that a derivative of an organic colorant such as an organic pigment or dyestuff is particularly advantageous for these purposes as will be described in more detail. The dispersant for use in the colored filter composition of a color filter according to the present invention is however not limited to a derivative of an organic pigment or dyestuff and may be provided by any of cationic, anionic and nonionic surfactants.

In the colored filter composition forming a color filter according to the present invention, preferably about 0.1 part to about 4 parts by weight of coloring compound is used for 1 part by weight of acrylic resin. The use of the dispersant in a proportion lower than the range of 0.01 part to 3 parts of coloring compound for 1 part of acrylic resin is effective to improve the performance characteristics of the color filter. The reduction in the proportion of the coloring compound in a color filter however requires increasing the thickness of the filter film for the purpose of achieving a desired optical density through the color filter. Increasing the thickness of the filter film is however objectionable in that extreme difficulties are encountered in precision machining the filter film. On the other hand, the use of more than 3 parts by weight of dispersant for 1 part by weight of acrylic resin results in significant reduction in the dispersibility of the coloring compound in the acrylic resin and in the applicability of the colored filter composition to the surface of the glass substrate 34.

Furthermore, it is preferable in the colored filter composition of a color filter according to the present invention that preferably about 0.005 part to about 1 part by weight of dispersant be used for 1 part by weight of coloring compound although this range of proportion is not of critical importance in a color filter according to the present invention. Where the coloring compound is used in a proportion ranging from 0.25:1 to 3:1 with respect to the acrylic resin and the dispersant used in a proportion ranging from 0.01:1 to 0.2:1 with respect to the coloring compound, there is produced a color filter film of a thickness ranging from about 0.75 micron to about 3.0 microns.

The acrylic resin component of the colored filter composition of a color filter according to the present invention is formed by the polymerization of acryl monomers which are commonly expressed by the following general formula:

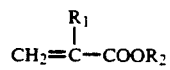

wherein $R_1$ represents a hydrogen atom or a methyl group and $R_2$ represents an alkyl group, a branchedchain alkyl (isoalkyl group), a phenyl group, a cyclohexyl group, or a tetrahydrofurfuryl group. Preferred examples of such an acryl monomer include

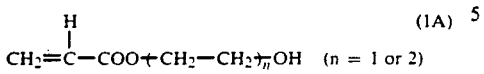 (1A)

(1A-1) When n = 1, the acryl monomer expressed by formula (1A) takes the form of hydroxymethyl acrylate expressed by the formula:

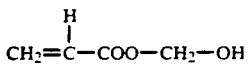

(1A-2) When n = 2, the acryl monomer expressed by formula (1A) takes the form of hydroxyethyl acrylate expressed by the formula:

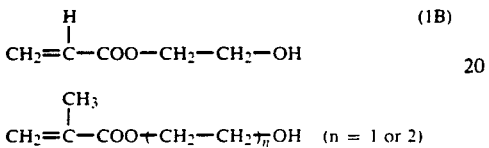 (1B)

(1B-1) When n = 1, the acryl monomer expressed by formula (1B) takes the form of hydroxymethyl methacrylate expressed by the formula:

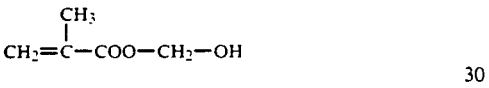

(1B-2) When n = 2, the acryl monomer expressed by formula (1B) takes the form of hydroxyethyl methacrylate expressed by the formula:

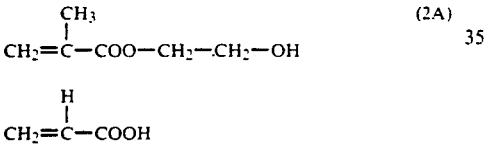 (2A)

(Acrylic acid)

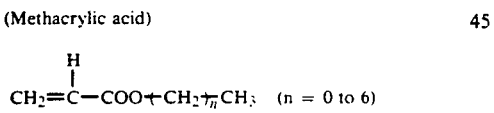 (2B)

(Methacrylic acid)

 (n = 0 to 6)

(3A-1) When n = 0, the acryl monomer expressed by formula (3A) takes the form of methyl acrylate expressed by the formula:

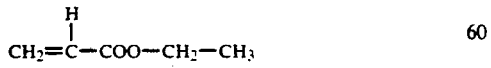

(3A-2) When n = 1, the acryl monomer expressed by formula (3A) takes the form of ethyl acrylate expressed by the formula:

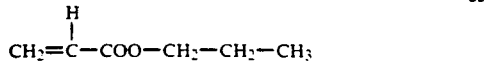

(3A-3) When n = 2, the acryl monomer expressed by formula (3A) takes the form of propyl acrylate expressed by the formula:

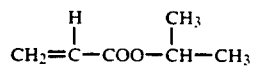

or takes the form of isopropyl acrylate expressed by the formula:

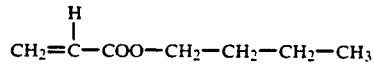

(3A-4) When n = 3, the acryl monomer expressed by formula (3A) takes the form of buthyl acrylate expressed by the formula:

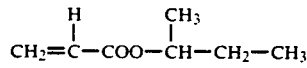

or takes the form of isobuthyl acrylate expressed by the formula:

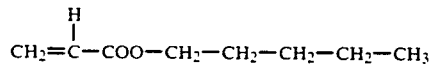

(3A-5) When n = 4, the acryl monomer expressed by formula (3A) takes the form of pentyl acrylate expressed by the formula:

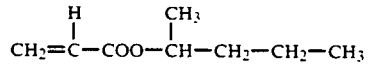

or takes the form of isopentyl acrylate expressed by the formula:

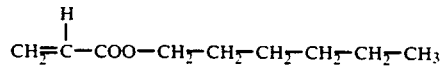

(3A-6) When n = 5, the acryl monomer expressed by formula (3A) takes the form of hexyl acrylate expressed by the formula:

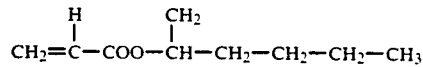

or takes the form of isohexyl acrylate expressed by the formula:

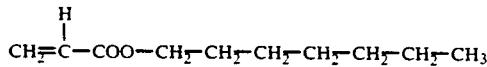

(3A-7) When n = 6, the acryl monomer expressed by formula (3A) takes the form of heptyl acrylate expressed by the formula:

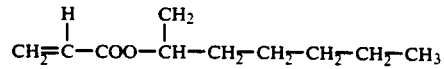

or takes the form of isoheptyl acrylate expressed by the formula:

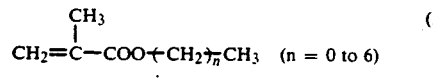

$CH_2=\overset{CH_3}{\underset{|}{C}}-COO(CH_2)_n CH_3$ (n = 0 to 6) (3B)

(3B-1) When n = 0, the acryl monomer expressed by formula (3B) takes the form of methyl methacrylate expressed by the formula:

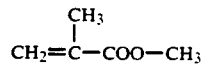

(3B-2) When n = 1, the acryl monomer expressed by formula (3B) takes the form of ethyl methacrylate expressed by the formula:

-continued

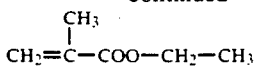

(3B-3) When n = 2, the acryl monomer expressed by formula (3B) takes the form of propyl methacrylate expressed by the formula:

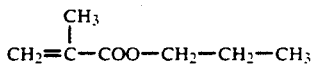

or takes the form of isopropyl methacrylate expressed by the formula:

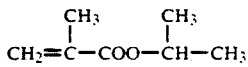

(3B-4) When n = 3, the acryl monomer expressed by formula (3B) takes the form of buthyl methacrylate expressed by the formula:

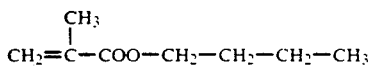

or takes the form of isobuthyl methacrylate expressed by the formula:

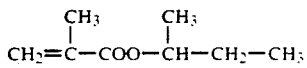

(3B-5) When n = 4, the acryl monomer expressed by formula (3B) takes the form of pentyl methacrylate expressed by the formula:

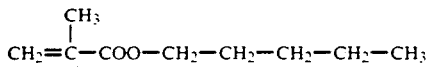

or takes the form of isopentyl methacrylate expressed by the formula:

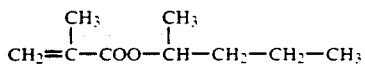

(3B-6) When n = 5, the acryl monomer expressed by formula (3B) takes the form of hexyl methacrylate expressed by the formula:

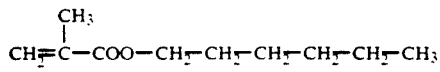

or takes the form of isohexyl methacrylate expressed by the formula:

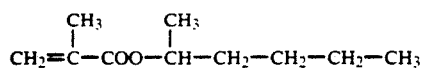

(3B-7) When n = 6, the acryl monomer expressed by formula (3B) takes the form of heptyl methacrylate expressed by the formula:

or takes the form of isoheptyl methacrylate expressed by the formula:

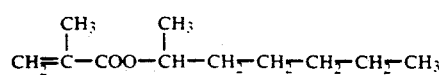

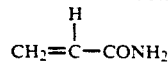 (4A)

(Dihydroacrylamide)

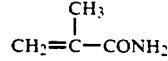 (4B)

(Dihydromethacrylamide)

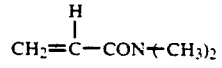 (5A)

(N,N-dimethyl acrylamide)

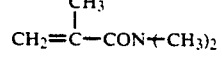 (5B)

(N,N-dimethyl methacrylamide)

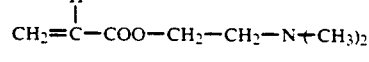 (6A)

(Dimethylaminoethyl acrylate)

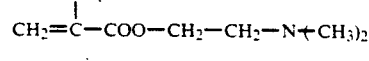 (6B)

(Dimethylaminoethyl methacrylate)

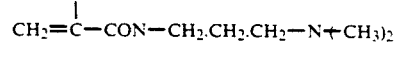 (7)

(Dimethylaminopropylacrylamide)

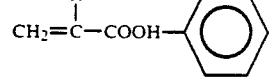 (8A)

(Phenyl acrylate)

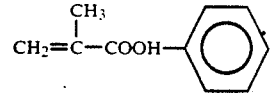 (8B)

(Phenyl methacrylate)

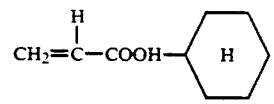 (9A)

(Cyclohexyl acrylate)

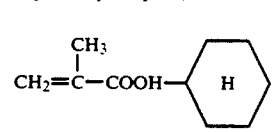 (9B)

(Cyclohexyl methacrylate)

The acrylic resin for use in the colored filter composition forming a color filter according to the present invention may be provided by the polymerization of one or more of these acryl monomers (1A) to (9B). If desired, the properties of the acrylic resin may be modified through addition of a small quantity of one or more of monomers such as dimethylmethacrylate, benzyl acrylate, glycidyl methacrylate, acrylonitrile, vinyl acetate, N-vinylpyrrolidon, and tetrahydrofurfuryl methacrylate.

If desired, two or more of the acryl monomers (1A) to (9B) may be selectively used to produce a copolymer having structural units formed by the selected monomers. Preferred combinations of the monomers are as follows:

(10) $\text{CH}_2=\overset{R_1}{\underset{|}{C}}-\text{COO}-\text{CH}_2-\text{CH}_2-\text{OH}$ (10a)

wherein $R_1$ represents a hydrogen atom or a methyl group. (Hydroxyethyl acrylate or hydroxyethyl methacrylate)

$\text{CH}_2=\overset{R_2}{\underset{|}{C}}-\text{COO}(\text{CH}_2)_n\text{CH}_3$ (n = 0 to 4) (10b)

wherein $R_2$ represents a hydrogen atom or a methyl group. (Methyl acrylate, ethyl acrylate, propyl acrylate, butyl acrylate, or pentyl acrylate)

$\text{CH}_2=\overset{H}{\underset{|}{C}}-\text{CON}(\text{CH}_3)_2$ (10c)

(N,N-dimethyl acrylamide)

It is preferable that the acrylic resin produced by the copolymerization of these monomers contains about 20 to 20 parts by weight of monomer (10a), about 10 to 10 parts by weight of monomer (10b) and about 15 to 60 parts by weight of monomer (10c). The properties of the acrylic resin produced by the copolymerization of the monomers (10a), (10b) and (10c) may be modified through addition of a small quantity of one or more of monomers such as benzyl acrylate, phenyl acrylate, glycidyl methacrylate, acrylonitrile, vinyl acetate, N-vinylpyrrolidon, and tetrahydrofurfuryl methacrylate.

(11) $\text{CH}_2=\overset{R_3}{\underset{|}{C}}-\text{COO}-\text{CH}_2-\text{CH}_2-\text{OH}$ (11a)

wherein $R_3$ represent a hydrogen atom or a methyl group. (Hydroxyethyl acrylate or hydroxyethyl methacrylate)

$\text{CH}_2=\overset{R_4}{\underset{|}{C}}-\text{COO}(\text{CH}_2)_n\text{CH}_3$ (n = 0 to 4) (11b)

wherein $R_4$ represents a hydrogen atom or a methyl group. (Methyl acrylate, ethyl acrylate, propyl acrylate, butyl acrylate, or pentyl acrylate)

$\text{CH}_2=\overset{H}{\underset{|}{C}}-\text{COO}-\text{CH}_2-\text{CH}_2-\text{N}(\text{CH}_3)_2$ (11c)

(Dimethylaminoethyl acrylate)

It is preferable that the acrylic resin produced by the copolymerization of these monomers contains about 20 to 40 parts by weight of monomer (11a), about 10 to 30 parts by weight of monomer (11b) and about 15 to 60 parts by weight of monomer (11c). The properties of the acrylic resin produced by the copolymerization of the monomers (11a), (11b) and (11c) may be modified through addition of a small quantity of one or more of monomers such as benzyl acrylate, phenyl acrylate, glycidyl methacrylate, acrylonitrile, vinyl acetate, N-vinylpyrrolidon, and tetrahydrofurfuryl methacrylate.

(12) $\text{CH}_2=\overset{R_5}{\underset{|}{C}}-\text{COOH}$ (12a)

wherein $R_5$ represents a hydrogen atom or a methyl group. (Acrylic acid or methacrylic acid)

$\text{CH}_2=\overset{R_6}{\underset{|}{C}}-\text{COOH}-\text{H}$ (12b)

wherein $R_6$ represents a hydrogen atom or a methyl group. (Cyclohexyl acrylate or cyclohexyl methacrylate)

$\text{CH}_2=\overset{R_7}{\underset{|}{C}}-\text{COO}(\text{CH}_2)_n\text{CH}_3$ (n = 0 to 4) (12c)

wherein $R_7$ represents a hydrogen atom or a methyl group. (Methyl acrylate, ethyl acrylate, propyl acrylate, butyl acrylate, pentyl acrylate, methyl methacrylate, ethyl methacrylate, propyl methacrylate, butyl methacrylate, or pentyl methacrylate)

It is preferable that the acrylic resin produced by the copolymerization of these monomers contains about 5 to 30 parts by weight of monomer (12a), about 15 to 35 parts by weight of monomer (12b) and about 35 to 80 parts by weight of monomer (12c). The properties of the acrylic resin produced by the copolymerization of the monomers (12a), (12b) and (12c) may be modified through addition of a small quantity of one or more of monomers such as dimethylaminomethacrylate, benzyl acrylate, glycidyl methacrylate, acrylonitrile, and vinyl acetate.

(13) $\text{CH}_2=\overset{R_8}{\underset{|}{C}}-\text{COOH}$ (13a)

wherein $R_8$ represents a hydrogen atom or a methyl group. (Acrylic acid or methacrylic acid)

$\text{CH}_2=\overset{H}{\underset{|}{C}}-\text{COO}(\text{CH}_2)_n\text{CH}_3$ (n = 0 to 5) (13b)

(Methyl acrylate, ethyl acrylate, propyl acrylate, bytyl acrylate, pentyl acrylate, or hexyl acrylate)

$\text{CH}_2=\overset{\text{CH}_3}{\underset{|}{C}}-\text{COO}(\text{CH}_2)_n\text{CH}_3$ (n = 0 to 5) (13c)

(Methyl methacrylate, ethyl methacrylate, propyl methacrylate, butyl methacrylate, pentyl methacrylate, or hexyl methacrylate)

It is preferable that the acrylic resin produced by the copolymerization of these monomers contains about 5 to 30 parts by weight of monomer (13a), about 20 to 40 parts by weight of monomer (13b) and about 40 to 60 parts by weight of monomer (13c). The properties of the acrylic resin produced by the copolymerization of the monomers (13a), (13b) and (13c) may be modified through addition of a small quantity of one or more of monomers such as benzyl acrylate, phenyl acrylate, glycidyl methacrylate, acrylonitrile, vinyl acetate, N-vintylpyrrolidon, and tetrahydrofurfuryl methacrylate.

(14) $CH_2=C-COOH$    (14a)

wherein $R_9$ represents a hydrogen atom or a methyl group. (Acrylic acid or methacrylic acid)

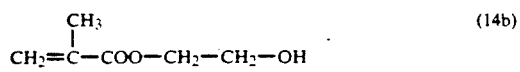

$CH_2=C-COO-CH_2-CH_2-OH$    (14b)

(Hydroxyethyl methacrylate)

$CH_2=C-COO-R_{11}$    (14c)

wherein $R_{10}$ represents a hydrogen atom or a methyl group and $R_{11}$ represents an alkyl group having 1 to 5 carbon atoms. One or two of the acryl monomers represented by formula (14c) may be contained in this combination (14).

It is preferably that the acrylic resin produced by the copolymerization of these monomers contains about 10 to 25 parts by weight of monomer (14a), about 10 to 30 parts by weight of the monomer (14b) and about 40 to 80 parts by weight of monomer (14c). The properties of the acrylic resin produced by the copolymerization of the monomers (14a), (14b) and (14c) may be modified through addition of a small quantity of one or more of monomers such as benzyl acrylate, phenyl acrylate, glycidyl methacrylate, acrylonitrile, vinyl acetate, N-vinylpyrrolidon, and tetrahydrofurfuryl methacrylate.

While a dyestuff may be used as the coloring compound in a color filter according to the present invention, a pigment is preferred for its heat and light resistances that excel those of dyestuffs as has been noted. Examples of a pigmant having an excelent heat resistance include inorganic pigments such as barium sulfate, lead sulfate, zinc flower, titanium oxide, chrome yellow, red iron oxide, ultramarine blue, prussian blue, chromium oxide, carbon black, and organic pigments such as Benzidine Yellow G (AAOT), Benzidine Yellow GR, Lithol Fast Orange 3GL, Lithol Fast Orange, Vulcan Fast Orange GG, Pigment Scarlet 3B, Thioindigo maroon, Phthalocyanine Blue B, Phthalocyanine Green, Indanthrene Blues, Green Gold, and Malachite Green Lake. Preferred examples of the pigment for use in the colored filter composition of a color filter according to the present invention are herein enumerated in terms of the Color Index (C.I.) Numbers.

| Pigment Yellow: | C.I. Nos. 20, 24, 86, 93, 109, 110, 117, 125, 137, 138, 147, 148, 153, 154, 166, 168 |
|---|---|
| Pigment Orange: | C.I. Nos. 36, 43, 51, 55, 59, 61 |
| Pigment Red: | C.I. Nos. 9, 97, 122, 123, 149, 168, 177, 180, 192, 215, 216, 217, 220, 223, 224, 226, 227, 228, 240 |
| Pigment Violet: | C.I. Nos. 19, 23, 29, 30, 37, 40, 50 |
| Pigment Blue: | C.I. Nos. 15, 15:6, 22, 60, 64 |
| Pigment Green: | C.I. Nos. 7, 36 |
| Pigment Brown: | C.I. Nos. 23, 25, 26 |
| Pigment Black: | C.I. No. 7 |

As has been noted, the dispersant for use in the colored filter composition forming a color filter according to the present invention preferably comprises a derivative of an organic pigment or dyestuff. As the organic colorant from which such a derivative is to result may be used any of azo compounds, phthalocyanine compounds, quinacridone compounds, anthraquinone compounds, perylene, perinone, thioindigo compounds, dioxazine compounds, isoindolenone (phthalimidine), quinophthalone, triphenylmethane, and various metal complexes. A suitable substituent is added to any of these organic colorants to enable the colorant to be uniformly distributed in the acrylic resin. Preferred examples of such a substituent include a hydroxyl group, a carboxyl group, a sulfonic acid group, a carvone amide group, a sulfonamide group, and any of the groups expressed by the following formulae:

$$-CH_2-X-A \quad (1)$$

wherein X represents an oxygen atom or an sulfur atom and A represents an aryl group.

(2)

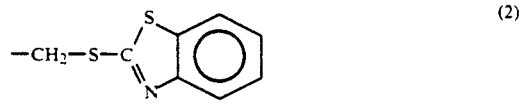

(3)

wherein X represents an alkylene group and each of $R_1$ and $R_2$ represents an atom of hydrogen, an alkyl group or a heterocyclic ring containing an atom of nitrogen in at least one of the rings $R_1$ and $R_2$.

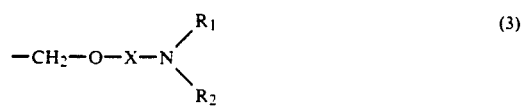

(4)

wherein $R_1$ represents an atom of hydrogen or an alkyl group and $R_2$ represents an alkyl group or an aryl group or each of $R_1$ and $R_2$ represents a heterocyclic ring containing an atom of nitrogen in at least one of the rings $R_1$ and $R_2$.

(5)

(6)

wherein A represents an alkylene group, $R_1$ represents an atom of hydrogen or an alkyl group, $R_2$ represents an alkyl group an alkoxyalkyl group or a cycloalkyl group, and $R_3$ represents an atom of hydrogen or a cycloalkyl group, or each of $R_2$ and $R_3$ represents a heterocyclic ring containing an atom of nitrogen in at least one of the rings $R_2$ and $R_3$.

Any desired one or more of these groups may be used to prepare a derivative of any one of the organic colorants previously enumerated. The colorant to be used for the preparation of the derivative for use as the dispersant is typically of the type similar to the coloring compound used in the colored filter composition of a color filter according to the present invention. This is preferable for the purpose of providing an excellent matching between the coloring compound and the dispersant in the resultant colored filter composition but is not essential in a color filter according to the present invention.

The colored filter composition of a color filter according to the present invention preferably contains about 5 per cent to 30 per cent by weight of acrylic resin although this range of percentage is variable in the present invention. As has been noted, furthermore, the proportion of the coloring compound in the colored filter composition ranges preferably from about 3 per cent to about 20 per cent by weight to the acrylic resin component of the filter composition. The proportion of the coloring compound with respect to the acrylic resin component may be increased beyond 300 per cent if desired. In addition, the proportion of the dispersant in the colored filter composition ranges preferably from about 0.1 part to about 3 part by weight to the coloring compound, as has also been noted.

A suitable organic solvent is used in preparing the colored filter composition to form a color filter according to the present invention. Preferred as such a solvent include methyl cellosolve ($\beta$-hydroxyethyl methyl ether), ethyl cellosolve ($\beta$-hydroxydiethyl ether), cyclohexanone, xylene, or a mixture of any two or more of these, although methyl cellosolve or cyclohexanone in particular is most preferred for its relatively high dissolubility. By preference, the colored filter composition forming a color filter according to the present invention may further contain any additive in a desired proportion. Typical examples of such an additive include any of commercially available primers which may be used to improve the bond between the layer of the colored filter composition and the substrate forming the color filter. A primer used for this purpose may be applied to and dried on the surface of the substrate before the layer of the colored filter composition is formed on the substrate.

For the preparation of the colored filter composition to form a color filter according to the present invention, monomers of an acrylic resin, a coloring compound, a dispersant and a solvent are blended in a desired proportion in a crushing and mixing apparatus such as for example a roller mill, a sand mill, an attrition mill. Alternatively, an acrylic resin a coloring compound, and a dispersant are blended in a desired proportion in a crushing and mixing apparatus such as a roller mill, whereupon the resultant mixture is diluted with a solvent or with a varnish consisting of an acrylic resin and a solvent. It may be noted that these processes of preparing the mixture to form the colored filter composition of a color filter according to the present invention are simply by way of example and may thus be modified in any desired manner or, by preference, may be substituted by any other process.

As has been noted, it is desirable to use a photosetting substance as the colored filter composition of a color filter for a multi-color liquid-crystal display panel structure. A chemical composition having a photosetting property is caused to set when exposed to light and is thus useful for defining filter elements with clear-cut contours in a multi-color liquid-crystal display panel structure.

Thus, the colored filter composition of a color filter according to the present invention is preferably processed to have a photosetting property. For this purpose, a photosensitive cross-linking compound may be added to the colored filter composition to set up chemical links between the molecular chains of the polymers contained in the colored filter composition. Preferred examples of the photosensitive cross-linking compound include any of various types of azides such as for example 1,3-bis(4'-azidobenzal)-2-propane, 1,3-bis(4'-azidobenzal)-2-propane-2'sulfonic acid, 4,4'-diazidostylbene-2,2'-disulfonic acid of which 4,4'-diazidostylbene-2,2'-disulfonic acid in particular is most preferred for its excellent solubility.

Alternatively, a combination of acryl monomers and a photopolymerization initiator may be added to the colored filter composition to otically polymerize the monomers and thereby afford a photosetting property to the colored filter composition. As the acryl monomers may be used either bifunctional monomers or trifunctional monomers. Preferred examples of the bifunctional monomers include 1,6-hexanediol diacrylate, ethylene glycol diacrylate, neobenzyl glycol diacrylate, triethylene glycol diacrylate, bis(acryloxy-ethoxy)bisphenol A, and 3-methylpenthanediol diacrylate. Preferred as the trifunctional monomers are trimethylolpropane acrylate, pentaerythritol triacrylate, and tris(2-hydroxyethyl)isocyanate. These bifunctional and trifunctional monomers are commercially available from Showa Highpolymer Company, Limited (Japan), Toagosei Chemical Industry Company, Limited (Japan) and Celanese Corporation of America (U.S.A.). On the other hand, preferred examples of the photopolymerization initiator include acetophenone, benzophenone, benzyldimethylketal, benzoyl peroxide, and 2-chlorothioxyanthone. These compounds are commercially available from Daito Chemical Industrial Company, Limited (Japan), Shin-nisso Kako Kabushiki Kaisha (Japan), Ciba-Geigy AG (Switzerland), and Osake Yukikagaku Kogyo Kabushiki Kaisha (Japan).

Thus, a process of preparing a color filter according to the present invention comprises the steps of (1) mixing monomers of an acrylic resin, a coloring compound and a dispersant in a suitable mixing apparatus such as a three-roller roll mill and dissolving these in an organic solvent in the mixing apparatus, (2) adding either a photosensitive cross-linking compound or a combination of a photopolymerization initiator and acryl monomers to the resultant preparation for producing a varnish colored in one of the desired colors such as typically the three primary colors of red, green and blue, (3) forming on the surface of a transparent substrate a multiplicity of discrete filter regions of the varnish distributed in a desired pattern and optically setting the individual filter regions, (4) heating the optically set filter regions on the substrate for causing condensation of the monomers contained in the filter regions and thereby forming discrete filter elements of a colored filter composition comprising the acrylic resin, coloring compound and dispersant.

The discrete colored filter regions of the colored filter composition may be formed in step (3) by forming a uniformly thick layer of the colored varnish on the surface of the substrate and subsequently patterning the layer of the colored varnish into discrete filter regions distributed in a desired pattern while optically setting the individual filter regions. Alternatively, the discrete colored filter regions may be formed by applying the varnish in a desired pattern onto the surface of the substrate.

The steps (1) to (4) are followed for each of the desired colors to form a multi-color filter structure so that the filter structure finally comprises the transparent substrate and a single layer of differently colored filter elements arranged in triads or in any desired groups each consisting of a predetermined number of differently colored filter elements. In the color filter thus prepared in accordance with the present invention, the acrylic resin component of the colored filter composition acts as a dispersion medium for the coloring compound. The dispersant in the colored filter composition serves to preclude condensation of the coloring compound and enable the coloring compound to be uniformly distributed in the acrylic resin as has been noted.

The process of preparing a color filter according to the present invention will be hereinafter described in more detail with reference to FIGS. 2A to 2C.

For the preparation of a colored varnish, monomers of an acrylic resin, a coloring compound and a dispersant are mixed together in a desired proportion and are dissolved in a suitable organic solvent in, for example, a three-roller roll mill. To the resultant preparation is added either a photosensitive cross-linking compound or a combination of a photopolymerization initiator and bifunctional or trifunctional acryl monomers to produce a varnish colored in one of the desired colors.

Figure 2A:
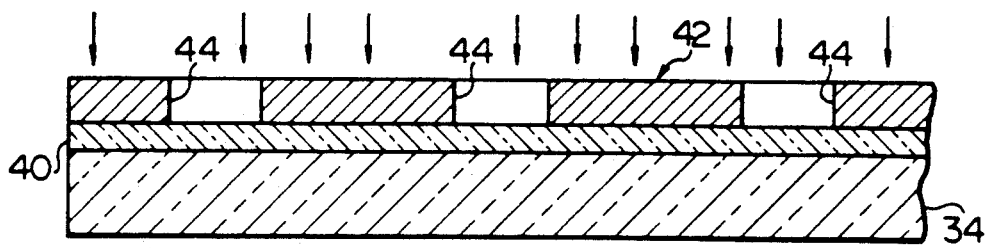
FIGS. 2A to 2C are fragmentary sectional views showing some of the steps of a process of preparing a color filter structure in accordance with to the present invention.
Figure 2B:
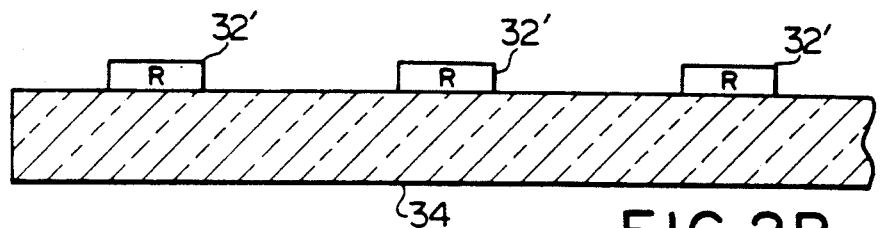

The colored varnish is applied to the surface of a transparent substrate 34 by, for example, a spin coating or roller coating method to form on the surface of the substrate 34 a layer 40 of the colored varnish having a desired thickness, as illustrated in FIG. 2A. The layer 40 of the colored varnish thus formed on the transparent substrate 34 is thereafter heated to, for example, about 230° C. to dispel the remaining solvent from the varnish forming the layer 40. A photographic mask 42 having a multiplicity of apertures or transparent areas 44 distributed in a pattern conforming to the pattern of distribution of the pixel elements of a single color is then placed on or over the layer 40 of the colored varnish.

The layer 40 of the colored varnish is then selectively exposed to light through the apertures or transparent areas 44 in the photomask 42, as indicated by arrows in FIG. 2A. An ultra-high pressure mercury lamp may be used as the source of light for the selective irradiation of the layer 40. Subsequently, the layer 40 of the colored varnish thus selectively exposed to light is developed by the use of a suitable chemical etchant (developer) to leave on the surface of the substrate 34 a multiplicity of single-colored discrete filter regions 46 of the optically set varnish as illustrated in FIG. 2B. The discrete colored filter regions 46 thus formed on the surface of the transparent substrate 34 are distributed in a pattern conforming to the pattern of distribution of the apertures or transparent areas 44 in the photomask 42 used and accordingly to the pattern of distribution of the pixel elements of a single color. The colored filter regions 46 on the substrate 34 are then heated to cause condensation of the monomers contained in the filter regions 46 and fix the filter regions 46 firmly to the surface of the substrate 34. Discrete film elements of a uni-colored filter composition comprising the acrylic resin, coloring compound and dispersant are thus fixedly formed on the surface of the substrate 34 to a thickness ranging from about 0.75 micron to about 3.0 microns.

Figure 2C:
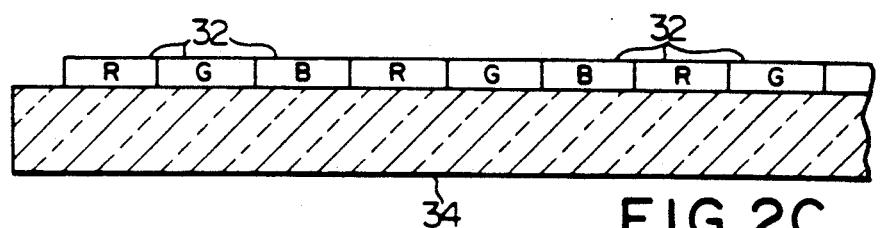

These process steps are followed for each of the desired colors to form a multi-color filter structure so that the filter structure finally comprise the transparent substrate 34 and a single layer of differently colored filter elements 32 which are herein shown colored in red (R), green (G) and blue (B) as illustrated in FIG. 2C. The colored filter elements 32 thus formed on the transparent substrate 34 are distributed in triads or in any desired groups each consisting of a predetermined number of differently colored filter elements. As has been described with reference to FIG. 1, the layer of the colored filter elements 32 is interposed between the common electrode 26 and the second transparent substrate 34 having the second linear polarizer film 36 attached to the outer face of the first transparent substrate 34.

Figure 3:
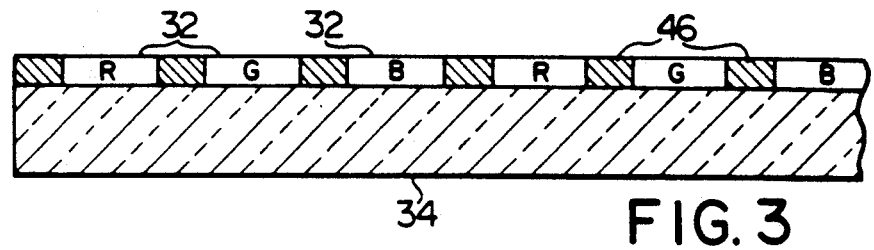
FIG. 3 is a fragmentary cross sectional view showing a color filter structure having black light-shielding strips formed between the individual color filter elements.

The individual colored filter elements 32 distributed on the surface of the transparent substrate 34 may be, if desired, slightly spaced apart from one another to form gaps between adjacent ones of the filter elements 32. These gaps are filled with a colored filter composition containing a black coloring compound. After the color filter elements 32 are formed throughout the surface of the transparent substrate 34, the regions of the black colored filter composition are exposed to light through the transparent substrate 34 and are subsequently baked. FIG. 3 shows the resultant structure having black light-shielding strips 38 formed between the individual color filter elements 32 and distributed in the form of parallel stripes or grilles.

The subject matter and other important aspects of the present invention will be better understood from the following Examples of a process according to the present invention.

EXAMPLE 1

(1-1) Used as the acryl monomers was the mixture of 20 parts by weight of methacrylic acid, 25 parts by weight of cyclohexyl acrylate and 55 parts by weight of methyl methacrylate.

(1-2) As the red coloring compound was used a mixture of 6.75 grams of Lyotegen Red GD (C.I. No. 168 Pigment Red, manufactured by Toyo Ink Manufacturing Company, Limited, Japan, hereinafter referred to simply as Toyo Ink) and 2.25 grams of Lyonogen Orange R (C.I. No. 36 Pigment Orange, manufactured by Toyo Ink). The dispersant used in combination with this red coloring compound was the compound expressed by the formula:

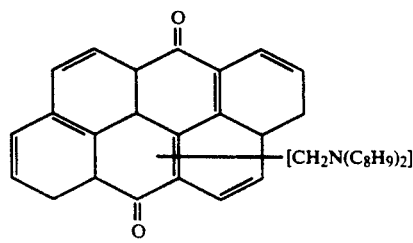

(1-3) As the green coloring compound was used a mixture of 6.75 grams of Lyonol Green 2YS(C.I. No. 26 Pigment Green, manufactured by Toyo Ink) and 2.25 grams of Lyonogen Yellow 3G (C.I. No. 154 Pigment Yellow, manufactured by Toyo Ink). The dispersant used in combination with this green coloring compound was the copper derivative of phthalocyanine (PC) expressed by the formula:

(1-4) As the blue coloring compound was used a mixture of 7.2 grams of Lyonol Blue ES (C.I. No. 15:6 Pigment Blue, manufactured by Toyo Ink) and 1.8 gram of Lyonogen Violet RL (C.I. No. 23 Pigment Violet, manufactured by Toyo Ink). The dispersant used in combination with this blue coloring compound was the copper derivative of phthalocyanine (PC) expressed by the formula:

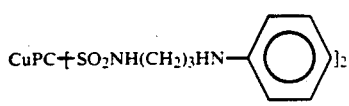

(1-5) Trimethylolpropane acrylate and benzyldimethylketal were used as acryl monomers and photopolymerization initiator, respectively, for affording a photosetting property to the acrylic resin.

(1-6) The mixture of the methacrylic acid, cyclohexyl acrylate and methyl methacrylate proportioned as above specified was dissolved in 300 parts by weight of ethyl cellosolve. To the resultant solution was added 0.75 part by weight of photopolymerization initiator α,α-azobisisobutyronitrile in the presence of nitrogen atmosphere, followed by reaction at 70° C. for five hours to cause copolymerization of the acryl monomers. The resinous preparation produced by this copolymerization reaction was diluted with ethyl cellosolve of a quantity selected to give a resin concentration of 10%. To 90.1 grams of this diluted resinous preparation were added 9.0 grams of coloring compound and 0.9 gram of dispersant, for each of the colors. Each of the resultant preparations was thoroughly blended in a three-roller roll mill. Red-, green- and blue-colored resinous solutions were thus prepared for the fabrication of red, green and blue color filters, respectively.

(1-7) To 100 grams of each of these resinous solutions were added 4.0 grams of trimethylolpropane triacrylate and 0.8 gram of benzyldimethylketal as the acryl monomers and photopolymerization initiator, respectively. The resultant preparation was thoroughly stirred for use as the uni-colored filter composition to form red, green or blue color filters.

γ-glycidoxypropylmethyl diethoxysilane was then spin coating onto the surface of a transparent substrate of glass. After spin drying, one of the red-, green- and blue-colored filter compositions, such as the blue-colored filter composition, was spin coated on the resultant coating on the glass substrate at 1100 rpm for 40 seconds, followed by spin drying. The layer of the colored filter composition thus formed on the substrate was prebaked at 70° C. for 20 minutes and was thereafter coated with a 5% solution of polyvinyl alcohol to form a protective oxygen-proof coating on the layer of the filter composition.

A photographic mask having a multiplicity of rectangular apertures each measuring 30 μm by 100 μm distributed in a pattern conforming to the pattern of distribution of the blue-colored pixel elements was then placed on the coated layer of the filter composition. The layer of the filter composition was selectively exposed to light with an exposure intensity of 1500 mJ/cm² through the apertures in the photomask with use of an ultra-high pressure mercury lamp as the source of light. Subsequently, the layer of the colored filter composition thus selectively exposed to light was developed by the use of a chemical etchant of 2.5% sodium carbonate to leave on the surface of the substrate a multiplicity of blue-colored discrete filter regions of the optically set filter composition. After the resultant structure was washed in water, the surface portions of the substrate having traces of pigment left thereon were cleaned by wiping the substrate with a soft sponge cleaner. The substrate was then washed in water for a second time and was, after spin drying, based at 230° C. for an hour to cause condensation of the monomers contained in the filter regions and form blue filter elements firmly attached to the surface of the substrate.

(1-8) The process steps (1-7) were followed for each of the red- and green-colored filter compositions to form a single layer of red-, green and blue-colored discrete filter elements fixed on the surface of the substrate. The layer of the filter elements was then coated with a 5% solution of melamine-epoxy copolymer (manufacture by Toyo Ink) and was thereafter baked at 230° for 120 minutes to form a transparent overcoat of the melamine-epoxy copolymer covering the individual filter elements.

Figure 4A:
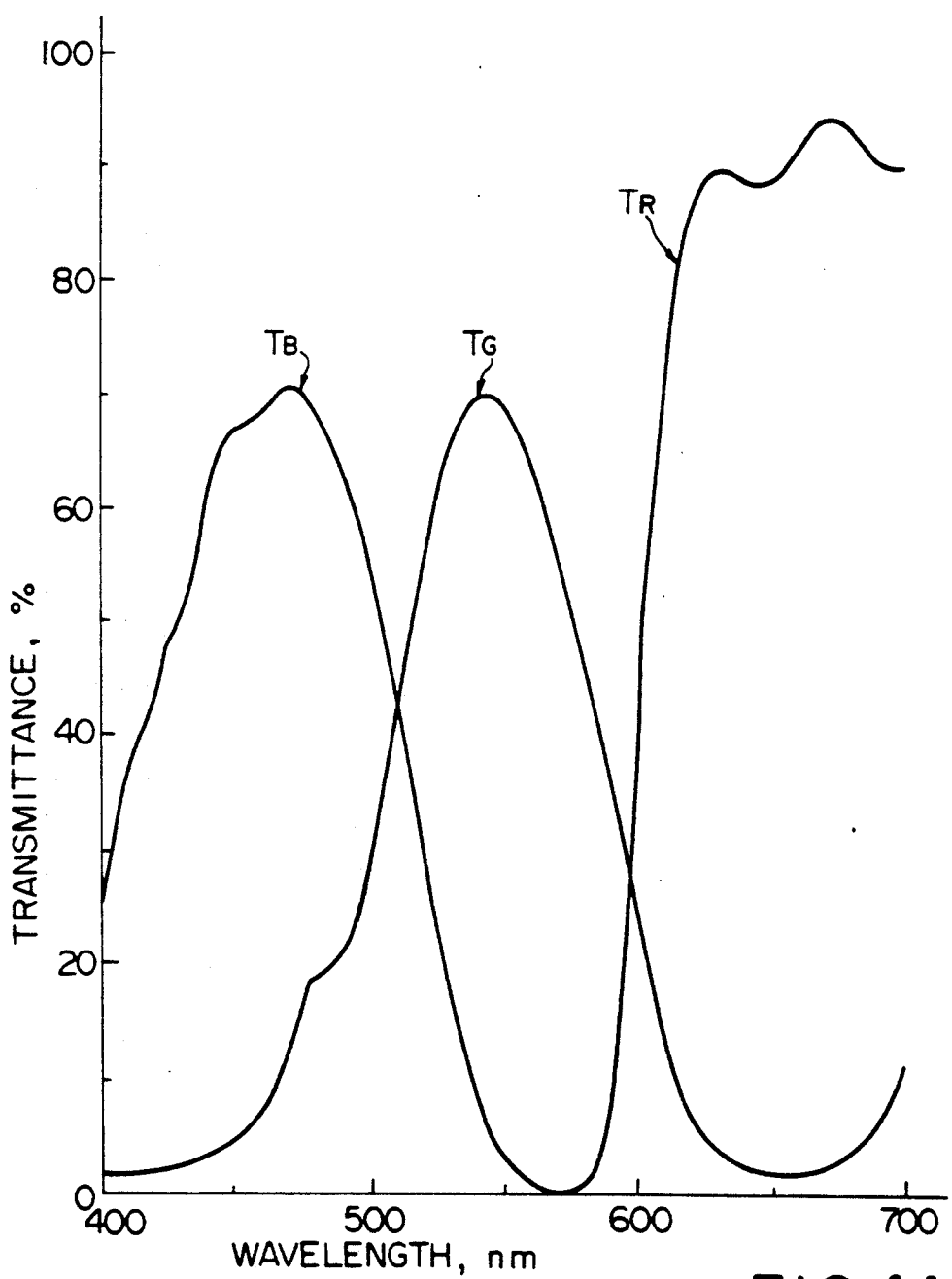
FIGS. 4A to 4D are graphic representations of the spectral transmittance of color filters provided by the present invention.

Tests have been conducted with the color filters fabricated in Example 1. The results of the tests show that the color filters endured the temperature of 250° C. for an hour, and the illuminance of $5.0 \times 10^4$ 1X (by xenon lamp) for more than 250 hours. FIG. 4A shows spectral transmittance curves $T_R$, $T_G$ and $T_B$ of the red, green and blue color filter elements, respectively, of the color filter fabricated in this Example 1 and each having a thickness of 1 micron. Curves $T_R$, $T_G$ and $T_B$ indicate that color filters have peak spectral transmittances of 97% for red, 70% for green and 71% for blue.

EXAMPLE 2

(2-1) Used as the acryl monomers was the mixture of 30 parts by weight of dimethylaminopropylmethacrylamidomethylchloride, 15 parts by weight of hydroxyethyl methacrylate, 25 parts by weight of dimethylaminoacrylamide and 30 parts by weight of tetrahydrofuffuryl methacrylate.

(2-2) As the red coloring compound was used a mixture of 6.75 grams of Lyocigen Red GD (C.I. No. 168 Pigment Red, manufactured by Toyo Ink) and 2.25 grams of Lyonogen Orange R (C.I. No. 36 Pigment Orange, manufactured by Toyo Ink). The dispersant used in combination with this red coloring compound was similar to the compound used in Example 1 and thus specified in paragraph (1-2).

(2-3) As the green coloring compound was used a mixture of 6.75 grams of Lyonol Green 2YS (C.I. No. 36 Pigment Green, manufactured by Toyo Ink) and 2.25 grams of Lyonogen Yellow 3G (C.I. No. 154 Pigment Yellow, manufactured by Toyo Ink). The dispersant used in combination with this green coloring compound was the copper derivative of phthalocyanine (PC) expressed by the formula:

(2-4) As the blue coloring compound was used a mixture of 7.2 grams of Lyonol Blue ES (C.I. No. 15:6 Pigment Blue, manufacture by Toyo Ink) and 1.8 gram of Lyonogen Violet RL (C.I. No. 23 Pigment Violet, manufacture by Toyo Ink). The dispersant used in combination with this blue coloring compound was the copper derivative of phthalocyanine (PC) expressed by the formula:

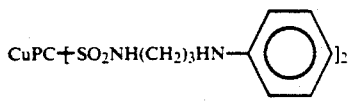

(2-5) Trimethylolpropane acrylate and benzyldimethylketal were also used as the acryl monomers and photopolymerization initiator, respectively, for affording a photosetting property to the acrylic resin.

(2-6) The mixture of the dimethylaminopropylmethacrylamidomethylchloride, hydroxyethyl methacrylate, diemthylaminoacrylamide and tetrahydrofuffuryl methacrylate proportioned as above specified was dissolved in 300 parts by weight of ethyl cellosolve. To the resultant solution was added 0.75 part by weight of photopolymerization initiator αα-azobisisobutyronitrile in the presence of nitrogen atmosphere, followed by reaction at 70° C. for five hours to cause copolymerization of the acryl monomers. The resinous preparation produced by this copolymerization reaction was diluted with ethyl cellosolve of a quantity selected to give a resin concentration of 10%. To 90.1 grams of this diluted resinous preparation were added 9.0 grams of coloring compound and 0.9 gram of dispersant, for each of the colors. Each of the resultant preparations was thoroughly blended in a three-roller roll mill. Red-, green- and blue-colored resinous solutions were thus prepared for the fabrication of red, green and blue color filters, respectively.

(2-7) To 100 grams of each of these resinous solutions were added 4.0 grams of trimethylolpropane triacrylate and 0.8 gram of benzyldimethylketal as the acryl monomers and photopolymerization initiator, respectively. The resultant preparation was thoroughly stirred for use as the uni-colored filter composition to form red, green or blue color filters.

γ-glycidoxypropylmethyl diethoxysilane was then spin coated onto the surface of a transparent substrate of glass. After spin drying, one of the red-, green- and blue-colored filter compositions, such as the blue-colored filter composition, was spin coated on the resultant coating on the glass substrate at 1100 rpm for 40 seconds, followed by spin drying. The layer of the colored filter composition thus formed on the substrate was prebaked at 70° C. for 20 minutes and was thereafter coated with a 5% solution of polyvinyl alcohol to form a protective oxygen-proof coating on the layer of the filter composition.

A photographic mask having a multiplicity of rectangular apertures each measuring 30 μm by 100 μm distributed in a pattern conforming to the pattern of distribution of the blue-colored pixel elements was then placed on the coated layer of the filter composition. The layer of the filter composition was selectively exposed to light with an exposure intensity of 1500 mJ/cm$^2$ through the apertures in the photomask with use of an ultra-high pressure mercury lamp as the source of light. Subsequently, the layer of the colored filter composition thus selectively exposed to light was developed by the use of a chemical etchant of 2.5% sodium carbonate to leave on the surface of the substrate a multiplicity of blue-colored discrete filter regions of the optically set filter composition. After the resultant structure was washed in water, the surface portions of the substrate having traces of pigment left thereon were cleaned by wiping the substrate with a soft sponge cleaner. The substrate was then washed in water for a second time and was, after spin drying, baked at 230° For an hour to cause condensation of the monomers contained in the filter regions and form blue filter elements firmly attached to the surface of the substrate.

(2-8) The process steps (2-7) were followed for each of the red- and green-colored filter compositions to form a single layer of red-, green and blue-colored discrete filter elements fixed on the surface of the substrate. For each of the red-colored and green-colored filter compositions, an exposure intensity of 500 mJ/cm$^2$ was used in exposing the layer of the filter composition to light. The layer of the filter elements was then coated with a 5% solution of melamine-epoxy resin (manufactured by Toyo Ink) and was thereafter baked at 230° for 120 minutes to form a transparent overcoat of the melamine-epoxy resin covering the individual filter elements.

Tests have been conducted with the color filters fabricated in Example 2. The results of the tests show that the color filters endured the temperature of 250° C. for an hour, and the illuminance of $5.0 \times 10^4$ 1× (by xenon lamp) for more than 250 hours. The tests have further revealed that the color filter elements fabricated in this Example 2 each to a thickness of 1 micron had peak spectral transmittances of 76% for red, 67% for green and 71% for blue.

EXAMPLE 3

(3-1) Used as the acryl monomers was the mixture of 30 parts by weight of hydroxyethyl methacrylate, 50 parts by weight of dimethylacrylamide and 20 parts by weight of methyl methacrylate.

(3-2) As the red coloring compound was used a mixture of 6.75 grams of Lyotgen Red GD (C.I. No. 168 Pigment Red, manufactured by Toyo Ink) and 2.25 grams of Lyonogen Orange R (C.I. No. 36 Pigment Orange, manufactured by Toyo Ink). The dispersant used in combination with this red coloring compound was also similar to the compound used in Example 1 and thus specified in paragraph (1-2).

(3-3) As the green coloring compound was used a mixture of 6.75 grams of Lyonol Green 2YS (C.I. No. 36 Pigment Green, manufactured by Toyo Ink) and 2.25 grams of Lyonogen Yellow 3G (C.I. No. 154 Pigment Yellow, manufactured by Toyo Ink). The dispersant used in combination with this green coloring compound was the copper derivative of phthalocyanine (PC) expressed by the formula:

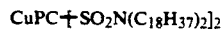

(3-4) As the blue coloring compound was used a mixture of 7.2 grams of Lyonol Blue ES (C.I. No. 15:6 Pigment Blue, manufactured by Toyo Ink) and 1.8 gram of Lyonogen Violet RL (C.I. No. 23 Pigment Violet, manufactured by Toyo Ink). The dispersant used in combination with this blue coloring compound was the copper derivative of phthalocyanine (PC) expressed by the formula:

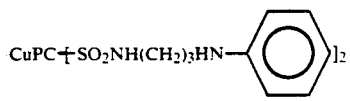

(3-5) As a photosensitive cross-linking compound was used 4,4-diazidostilbene-2,2'-disulfonic acid for affording a photosetting property to the acrylic resin.

(3-6) The mixture of the hydroxyethyl methacrylate, dimethylacrylamide and methyl methacrylate proportioned as above specified was dissolved in 300 parts by weight of ethyl cellosolve. To the resultant solution was added 0.75 part by weight of photopolymerization initiator α,α-azobisisobutyronitrile in the presence of nitrogen atmosphere, followed by reaction at 70° C. for five hours to cause copolymerization of the acryl monomers. The resinous preparation produced by this copolymerization reaction was diluted with ethyl cellosolve of a quantity selected to give a resin concentration of 10%. To 90.1 grams of this diluted resinous preparation were added 9.0 grams of coloring compound and 0.9 gram of dispersant, for each of the colors. Each of the resultant preparations was thoroughly blended in a three-roller roll ill. Red-, green- and blue-colored resinous solutions were thus prepared for the fabrication of red, green and blue color filters, respectively.

(3-7) To 100 grams of each of these resinous solutions was added 1.2 gram of 4,4-diazidostilbene-2,2'-disulfonic acid as the photosensitive cross-linking compound. The resultant preparation was thoroughly stirred for use as the uni-colored filter composition to form red, green or blue color filters.

γ-glycidoxypropylmethyl diethoxysilane was then spin coated onto the surface of a transparent substrate of glass. After spin drying, one of the red-, green- and blue-colored filter compositions, such as the blue-colored filter composition, was spin coated on the resultant coating on the glass substrate at 1300 rpm for 50 seconds, followed by spin drying. The layer of the colored filter composition thus formed on the substrate was prebaked at 60° C. for 20 minutes.

A photographic mask having a multiplicity of rectangular apertures each measuring 30 μm by 100 μm distributed in a pattern conforming to the pattern of distribution of the blue-colored pixel elements was then placed on the coated layer of the filter composition. The layer of the filter composition was selectively exposed to light with an exposure intensity of 3000 mJ/cm² through the apertures in the photomask with use of an ultra-high pressure mercury lamp as the source of light. Subsequently, the layer of the colored filter composition thus selectively exposed to light was developed by the use of an aqueous solution of isopropyl alcohol to leave on the surface of the substrate a multiplicity of blue-colored discrete filter regions of the optically set filter composition. The substrate was then baked at 170° C. for an hour to cause condensation of the monomers contained in the filter regions and form blue filter elements firmly attached to the surface of the substrate.

(3-8) The process steps (2-7) were followed for each of the red- and green-colored filter compositions to form a single layer of red-, green and blue-colored discrete filter elements fixed on the surface of the substrate. For the red-colored and green-colored filter compositions, exposure intensities of 500 mJ/cm² and 700 mJ/cm², respectively, were used in exposing the layers of the filter compositions to light. The layer of the filter elements was then coated with a 5% solution of melamine-epoxy resin (manufactured by Toyo Ink) and was thereafter baked at 230° for 120 minutes to form a transparent overcoat of the melamine-epoxy copolymer covering the individual filter elements.

Figure 4B:
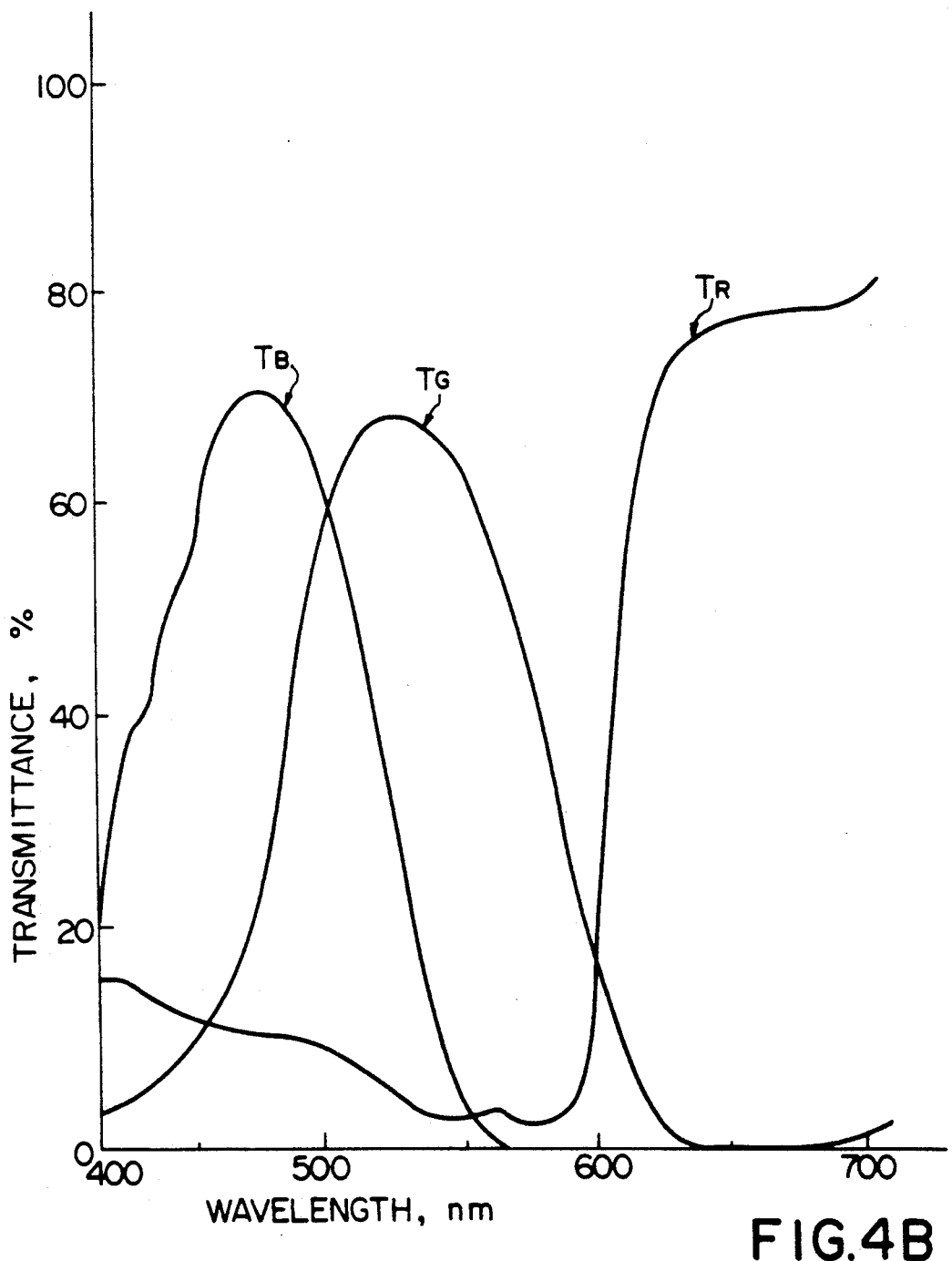

Tests have been conducted with the color filters fabricated in Example 3. The results of the tests show that the color filters endured the temperature of 250° C. for an hour, and the illuminance of $5.0 \times 10^4$ 1× (by xenon lamp) for more than 250 hours. FIG. 4B shows spectral transmittance curves $T_R$, $T_G$ and $T_B$ of the red, green and blue color filter elements, respectively, of the color filter fabricated in this Example 3 and each having a thickness of 1 micron. Curves $T_R$, $T_G$ and $T_B$ indicate that color filters have peak spectral transmittances of 94% for red, 70% for green and 70% for blue.

EXAMPLE 4

(4-1) Used as the acryl monomers was the mixture of 20 parts by weight of methacrylic acid, 30 parts by weight of butyl acrylate and 50 parts by weight of butyl methacrylate.

(4-2) As the red coloring compound was used a mixture of 6.75 grams of Lyotgen Red GD (C.I. No. 168 Pigment Red, manufactured by Toyo Ink) and .2.25 grams of Lyonogen Orange R (C.I. No. 36 Pigment Orange, manufactured by Toyo Ink). The dispersant used in combination with this red coloring compound was also similar to the compound used in Example 1 and thus specified in paragraph (1-2).

(4-3) As the green coloring compound was used a mixture of 6.75 grams of Lyonol Green 2YS (C.I. No. 36 Pigment Green, manufactured by Toyo Ink) and 2.25 grams of Lyonogen Yellow 3G (C.I. No. 154 Pigment Yellow, manufactured by Toyo Ink). The dispersant used in combination with this green coloring compound was the copper derivative of phthalocyanine (PC) expressed by the formula:

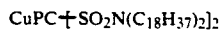

(4-4) As the blue coloring compound was used a mixture of 7.2 grams of Lyonol Blue ES (C.I. No. 15:6 Pigment Blue, manufactured by Toyo Ink) and 1.8 gram of Lyonogen Violet HR (C.I. No. 23 Pigment Violet, manufactured by Toyo Ink). The dispersant used in combination with this blue coloring compound was the copper derivative of phthalocyanine (PC) expressed by the formula:

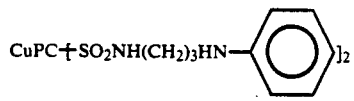

(4-5) As the acryl monomers and photopolymerization initiator for affording a photosetting property to the acrylic resin were used trimethylolpropane acrylate and benzyldimethylketal, respectively.

(4-6) The mixture of the methacrylic acid, butyl acrylate and butyl methacrylate proportioned as above specified was dissolved in 300 parts by weight of ethyl cellosolve. To the resultant solution was added 0.75 part by weight of photopolymerization initiator α,α-azobisisobutyronitrile in the presence of nitrogen atmosphere, followed by reaction at 70° C. for five hours to cause copolymerization of the acryl monomers. The resinous preparation produced by this copolymerization reaction was diluted with ethyl cellosolve of a quantity selected to give a resin concentration of 10%. To 90.1 grams of this diluted resinous preparation were added 9.0 grams of coloring compound and 0.9 gram of dispersant, for each of the colors. Each of the resultant preparations was thoroughly blended in a three-roller roll mill. Red-, green- and blue-colored resinous solutions were thus prepared for the fabrication of red, green and blue color filters, respectively.

(4-7) To 100 grams of each of these resinous solutions were added 4.0 grams of trimethylolpropane triacrylate and 0.8 gram of benzyldimethylketal as the acryl monomers and photopolymerization initiator, respectively. The resultant preparation was thoroughly stirred for use as the uni-colored filter composition to form red, green or blue color filters.

γ-glycidoxypropylmethyl diethoxysilane was then spin coated onto the surface of a transparent substrate of glass. After spin drying, one of the red-, green- and blue-colored filter compositions, such as the blue-colored filter composition, was spin coated on the resultant coating on the glass substrate at 1100 rpm for 40 seconds, followed by spin drying. The layer of the colored filter composition thus formed on the substrate was prebaked at 70° C. for 20 minutes and was thereafter coated with a 5% solution of polyvinyl alcohol to form a protective oxygen-proof coating on the layer of the filter composition.

A photographic mask having a multiplicity of rectangular apertures each measuring 30 μm by 100 μm distributed in a pattern conforming to the pattern of distribution of the blue-colored pixel elements was then placed on the coated layer of the filter composition. The layer of the filter composition was selectively exposed to light with an exposure intensity of 1500 mJ/cm$^2$ through the apertures in the photomask with use of an ultra-high pressure mercury lamp as the source of light. Subsequently, the layer of the colored filter composition thus selectively exposed to light was developed by the use of a chemical etchant of 2.5% sodium carbonate to leave on the surface of the substrate a multiplicity of blue-colored discrete filter regions of the optically set filter composition. After the resultant structure was washed in water, the surface portions of the substrate having traces of pigment left thereon were cleaned by wiping the substrate with a soft sponge cleaner. The substrate was then washed in water for a second time and was, after spin drying, baked at 230° C. for an hour to cause condensation of the monomers contained in the filter regions and form blue filter elements firmly attached to the surface of the substrate.

(4-8) The process steps (4-7) were followed for each of the red- and green-colored filter compositions to form a single layer of red- , green and blue-colored discrete filter elements fixed on the surface of the substrate. The layer of the filter elements was then coated with a 5% solution of melamine-epoxy copolymer (manufactured by Toyo Ink) and was thereafter baked at 230° for 120 minutes to form a transparent overcoat of the melamine-epoxy resin covering the individual filter elements.

Figure 4C:
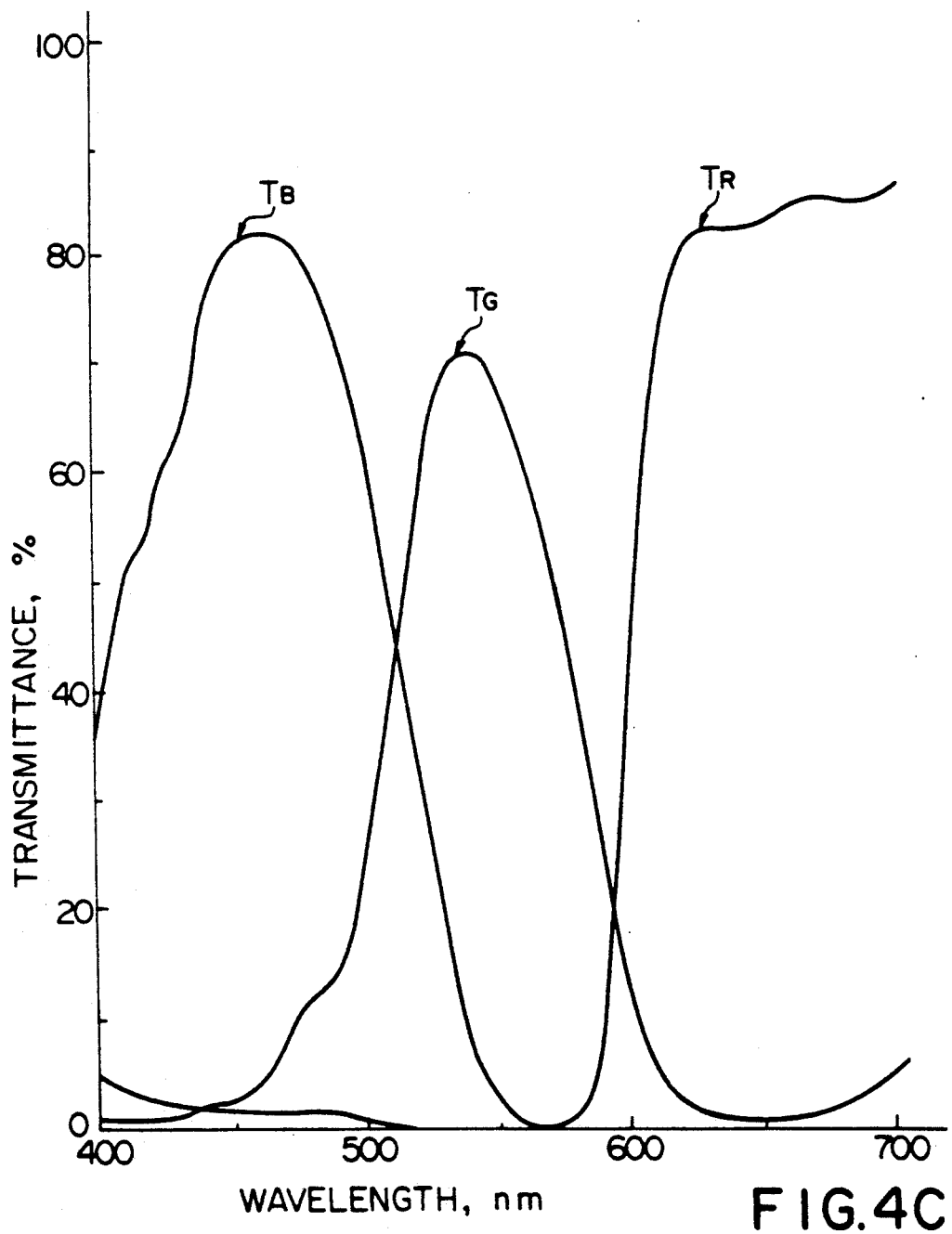

Tests have been conducted with the color filters fabricated in Example 4. The results of the tests show that the color filters endured the temperature of 240° C. for an hour, and the illuminance of $5.0 \times 10^4$ 1x (by xenon lamp) for more than 250 hours. FIG. 4C shows spectral transmittance curves $T_R$, $T_G$ and $T_B$ of the red, green and blue color filter elements, respectively, of the color filter fabricated in this Example 4 and each having a thickness of 1 micron. Curves $T_R$, $T_G$ and $T_B$ indicate that color filters have peak spectral transmittances of 87% for red, 71% for green and 82% for blue.

EXAMPLE 5

(5-1) Used as the acryl monomers was the mixture of 20 parts by weight of methacrylic acid, 15 parts by weight of hydroxyethyl methacrylate, 10 parts by weight of methyl methacrylate and 55 parts by weight of butyl methacrylate.

(5-2) As the red coloring compound was used a mixture of 6.75 grams of Lyotgen Red GD (C.I. No. 168 Pigment Red, manufactured by Toyo Ink) and 2.25 grams of Lyonogen Orange R (C.I. No. 36 Pigment Orange, manufactured by Toyo Ink). The dispersant used in combination with this red coloring compound was also similar to the compound sued in Example 1 and thus specified in paragraph (1-2).

(5-3) As the green coloring compound was used a mixture of 6.75 grams of Lyonol Green 2YS (C.I. No. 36 Pigment Green, manufactured by Toyo Ink) and 2.25 grams of Lyonogen Yellow 3G (C.I. No. 154 Pigment Yellow, manufactured by Toyo Ink). The dispersant used in combination with this green coloring compound was the copper derivative of phthalocyanine (PC) expressed by the formula:

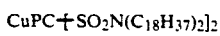

(5-4) As the blue coloring compound was used a mixture of 7.2 grams of Lyonol Blue ES (C.I. No. 15:6 Pigment Blue, manufactured by Toyo Ink) and 1.8 gram of Lyonogen Violet HR (C.I. No. 23 Pigment Violet, manufactured by Toyo Ink). The dispersant used in combination with this blue coloring compound was the copper derivative of phthalocyanine (PC) expressed by the formula:

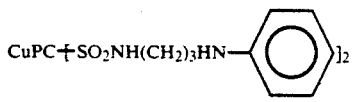

(5-5) As the acryl monomers and photopolymerization initiator for affording a photosetting property to the acrylic resin were used trimethylolpropane acrylate and 4,4'-diethylaminobenzophenone, respectively.

(5-6) The mixture of the acrylate, acrylate and acrylate proportioned as above specified was dissolved in 300 parts by weight of ethyl cellosolve. To the resultant solution was added 0.75 parts by weight of photopolymerization initiator α,α-azobisisobutyronitrile in the presence of nitrogen atmosphere, followed by reaction at 70° C. for five hours to cause copolymerization of the acryl monomers. The resinous preparation produced by this copolymerization reaction was diluted with ethyl cellosolve of a quantity selected to give a resin concentration of 10%. To 90.1 grams of this diluted resinous preparation were added 9.0 grams of coloring compound and 0.9 gram of dispersant, for each of the colors. Each of the resultant preparations was thoroughly blended in a three-roller roll mill. Red-, green- and blue-colored resinous solutions sere thus prepared for the fabrication of red, green and blue color filters, respectively.

(5-7) to 100 grams of each of these resinous solutions were added 7.0 grams of trimethylolpropane triacrylate and 1.5 gram of 4,4'-diethylaminobenzophenone as the acryl monomers and photopolymerization initiator, respectively. The resultant preparation was thoroughly stirred for use as the uni-colored filter composition to form red, green or blue color filters.

γ-glycidoxypropylmethyl diethoxysilane was then spin coated onto the surface of a transparent substrate of glass. After spin drying, one of the red-, green- and blue-colored filter compositions, such as the blue-colored filter composition, was spin coated on the resultant coating on the glass substrate at 1100 rpm for 40 seconds, followed by spin drying. The layer of the colored filter composition thus formed on the substrate was prebaked at 70° C. for 20 minutes and was thereafter coated with a 5% solution of polyvinyl alcohol to form a protective oxygen-proof coating on the layer of the filter composition.

A photographic mask having a multiplicity of rectangular apertures each measuring 30 μm by 100 μm distributed in a pattern conforming to the patter of distribution of the blue-colored pixel elements was the placed on the coated layer of the filter composition. The layer of the filter composition was selectively exposed to light with an exposure intensity of 3000 mJ/cm$^2$ through the apertures in the photomask with use of an ultra-high pressure mercury lamp as the source of light. Subsequently, the layer of the colored filter composition thus selectively exposed to light was developed by the use of a chemical etchant of 2.5% sodium carbonate to leave on the surface of the substrate a multiplicity of blue-colored discrete filter regions of the optically set filter composition. After the resultant structure was washed in water, the surface portions of the substrate having traces of pigment left thereon were cleaned by wiping the substrate with a soft sponge cleaner. The substrate was then washed in water for a second time and was, after spin drying, baked at 230° C. for an hour to cause condensation of the monomers contained in the filter regions and form blue filter elements firmly attached to the surface of the substrate.

(5-8) The process steps (5-7) were followed for each of the red- and green-colored filter compositions to form a single layer of red-, green and blue-colored discrete filter elements fixed on the surface of the substrate. The layer of the filter elements was then coated with a 5% solution of melamine-epoxy resin (manufactured by Toyo Ink) and was thereafter baked at 230° for 120 minutes to form a transparent overcoat of the melamine-epoxy resin covering the individual filter elements.

Figure 4D:
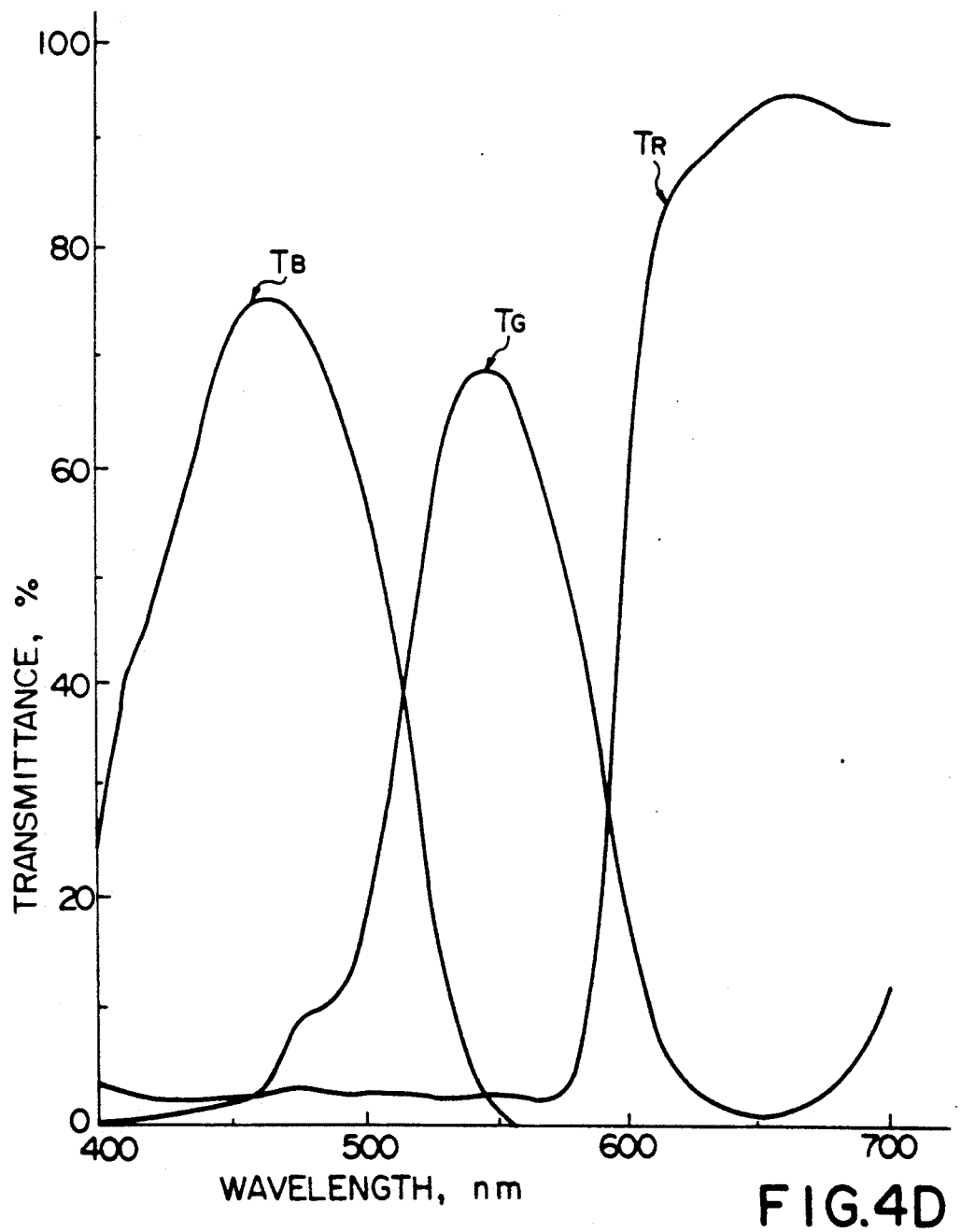

Tests have been conducted with the color filters fabricated in Example 5. The results of the tests show that the color filters endured the temperature of 260° C. for an hour, and the illuminance of $5.0 \times 10^4$ 1× (by xenon lamp) for more than 240 hours. The tests have further relealed that the color filters fabricated in Example 5 had the surface roughness of ±0.1 mm. FIG. 4D shows spectral transmittance curves $T_R$, $T_G$ and $T_B$ of the red, green and blue color filter elements, respectively, of the color filter fabricated in this Example 5 and each having a thickness of 1 micron. Curves $T_R$, $T_G$ and $T_B$ indicate that the color filters have peak spectral transmittances of 95% for red, 68% for green and 75% for blue.

It will now be understood that the advantages of a color filter according to the present invention are to be exploited in color filters for a multi-color liquid-crystal display panel structure but it is apparent that the present invention is applicable to color filters of a uni-color liquid-crystal display panel structure.

The following table show the temperature resistances (in centigrade degrees for an hour), light resistances (in hours when irradiated with 50,000 1×) and peak spectral transmittances (in percentage) for red, green and blue of the color filters fabricated in Examples 1 to 5.

|  | Ex. 1 | Ex. 2 | Ex. 3 | Ex. 4 | Ex. 5 |
| --- | --- | --- | --- | --- | --- |
| Heat resistance | 250° C. | 250° C. | 250° C. | 240° C. | 260° C. |
| Light resistance (hrs, more than) | 250 | 250 | 250 | 250 | 250 |
| Transmittance |  |  |  |  |  |
| Red (%) | 97 | 76 | 76 | 87 | 95 |
| Green (%) | 70 | 67 | 67 | 71 | 68 |
| Blue (%) | 71 | 71 | 71 | 82 | 75 |

For comparison with these color filters with conventional color filters for use in liquid-crystal display panels, specimens of color filters were prepared with use of gelatine as the base materials and various known dyestuffs as the coloring compounds. The tests conducted with the resultant color filters indicated that the color filters endured the temperatures of 180° C. to 190° C. for an hour, and the illuminance of $5.0 \times 10^4$ 1× for less than 200 hours. These results of the tests evidence the excellent light and heat resistances of the color filters fabricated in accordance with the present invention over those fabricated with use of a naturally occurring organic substance and a dyestuff. In respect of clarity, the tests conducted with the specimens indicated that the specimen color filters had peak spectral transmittances of 70% to 95% for each of the colors (red, green and blue) and were thus acceptable similarly to those fabricated in Examples 1 to 5.

Specimens were further prepared with use of polyimide resins as the base materials and organic pigments similar to those used in each of Examples 1 to 5 as the coloring compounds. The tests conducted with the resultant color filters indicated that the color filters were acceptable in respect of light and heat resistances. In respect of clarity, however, the tests conducted with the specimens indicated that the specimen color filters had peak spectral transmittances of the order of 60% for each of the colors and were inferior in respect of clarity to those fabricated in Examples 1 to 5.

What is claimed is:

1. A color filter for use in a liquid-crystal display panel structure, comprising:
    a) a transparent substrate having a surface portion, wherein said substrate is formed of a transparent substance selected from the group consisting of glass and synthetic resin; and
    b) a multiplicity of filter elements distributed in a predetermined pattern on said surface portion of said substrate, each of the filter elements being formed of a photo-setting colored filter composition containing an acrylic resin, a coloring compound and a dispersant, wherein said acrylic resin comprises copolymers having structural units expressed by the general formulae:

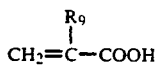

5(a)

wherein R$_9$ represents a hydrogen atom or methyl group;

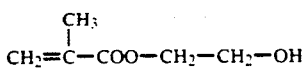  (5b)

and

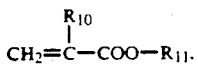  (5c)

wherein R$_{10}$ represents a hydrogen atom or a methyl group and R$_{11}$ represents an alkyl group having 1 to 5 carbon atoms.

2. A color filter as set forth in claim 1, in which said dispersant comprises a derivative of an organic colorant selected from the group consisting of azo compounds, phthalocyanine compounds, guinacridone compounds, anthraquinone compounds, perylene, perinone, thioindigo compounds, dioxazine compounds, isoindolenone, quinophthalone, triphenylmethane and metal complex salts.

3. A color filter as set forth in claim 1, further comprising a transparent overcoat of a synthetic resin covering said filter elements.

4. A color filter as set forth in claim 1, in which said acrylic resin contains 10 to 25 parts by weight of monomer (5a), 10 to 30 parts by weight of monomer (5b) and 40 to 80 parts by weight of monomer (5c).

5. A color filter as set forth in claim 1, in which said acrylic resin further comprises a structural unit selected from the group consisting of phenyl acrylate, glycidyl methacrylate, acrylonitrile, vinyl acetate, N-vinyl-pyrrolidone, and tetrahydrofurfuryl methacrylate.

6. A color filter as set forth in claim 1, in which said coloring compound is selected from the group consisting of Benzidine Yellow G (AAOT), Benzidine Yellow GR, Lithol Fast Orange 3GL, Lithol Fast Orange, Vulcan Fast Orange GG, Pigment Scarlet 3B, Thioindigo maroon, Phthalocyanine Blue B, Phthalocyanine Green, Indanthrene Blues, Green Gold, and Malachite Green Lake.

7. A color filter as set forth in claim 1, in which said coloring compound comprises a pigment selected from the group consisting of the following pigments denoted in terms of the Color Index (C.I.) Numbers:

| Pigment Yellow: | C.I. Nos. 20, 24, 86, 93, 109, 110, 117, 125, 137, 138, 147, 148, 153, 154, 166, 168 |
|---|---|
| Pigment Orange: | C.I. Nos. 36, 43, 51, 55, 59, 61 |
| Pigment Red: | C.I. Nos. 9, 97, 122, 123, 149, 168, 177, 180, 192, 215, 216, 217, 220, 223, 224, 226, 227, 228, 240 |
| Pigment Violet: | C.I. Nos. 19, 23, 29, 30, 37, 40, 50 |
| Pigment Blue: | C.I. Nos. 15, 15:6, 22, 60, 64 |
| Pigment Green: | C.I. Nos. 7, 36 |
| Pigment Brown: | C.I. Nos. 23, 25, 26, and |
| Pigment Black: | C.I. No. 7. |

8. A color filter as set forth in claim 2, in which said organic colorant has added thereto a substituent selected from the group consisting of a hydroxyl group, a carboxyl group, a sulfonic acid group, a carvone amide group, and a sulfonamide group, said substituent serving as a dispersant.

9. A color filter as set forth in claim 2, in which said organic colorant has added thereto a substituent expressed by the formula; —CH$_2$X—A, wherein X represents an atom of oxygen or of sulfur and A represents an aryl group, said substituent serving as dispersant.

10. A color filter as set forth in claim 2, in which said organic colorant has added thereto a substituent expressed by the formula;

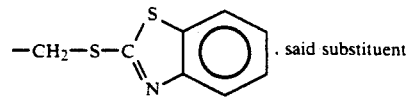, said substituent serving as a dispersant.

11. A color filter as set forth in claim 2, in which said organic colorant has added thereto a substituent expressed by the formula:

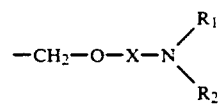

wherein X represents an alkylene group and each of R$_1$ and R$_2$ represents an atom of hydrogen, an alkyl group or a heterocyclic ring containing an atom of nitrogen in at least one of the rings R$_1$ and R$_2$.

12. A color filter as set forth in claim 2, in which said organic colorant has added thereto a substituent expressed by the formula;

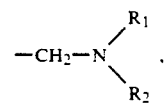

and in which said substituent serving as a dispersant wherein R$_1$ represents an atom of hydrogen or an alkyl group and R$_2$ represents an alkyl group or an aryl group or each of R$_1$ and R$_2$ represents a heterocyclic ring containing an atom of nitrogen in at least one of the rings R$_1$ and R$_2$.

13. A color filter as set forth in claim 2, in which said organic colorant has added thereto a substituent expressed by the formula;

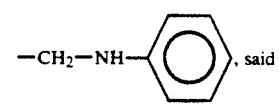, said substituent serving as a dispersant.

14. A color filter as set forth in claim 2, in which said organic colorant has added thereto a substituent expressed by the formula;

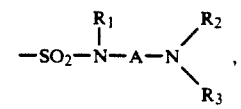, said substituent serving as a dispersant, where A represents an alkylene group, R$_1$ represents an atom of hydrogen or an alkyl group, R$_2$ represents an alkyl group an alkoxyalkyl group or a cycloalkyl group, and R$_3$ represents an atom of hydrogen or a cycloalkyl group, or each of R$_2$ and R$_3$ represents a heterocyclic ring containing an atom of nitrogen in at least one of the rings $R_2$ and $R_3$.

15. A color filter as set forth in claim 1, which said colored filter composition contains 5 percent to 30 percent by weight of acrylic resin.

16. A color filter as set forth in claim 15, in which said colored filter composition contains 3 percent to 20 percent by weight of said coloring compound.

17. A color filter as set forth in claim 15, in which said colored filter composition contains 0.01 percent to 3 percent by weight of said dispersant.

18. A color filter as set forth in claim 15, in which said colored filter composition contains said coloring compound in a range of from 10 percent to 400 percent by weight with respect to said acrylic resin.

19. A color filter as set forth in claim 15, in which said colored filter composition contains said dispersant in a range of from 0.05 percent to 100 percent by weight with respect to said coloring compound.

20. A color filter as set forth in claim 1, in which said colored filter composition has further contained therein a photosensitive cross-linking compound.

21. A color filter as set forth in claim 20, in which said photosensitive cross-linking compound is selected from a group of azides.

22. A color filter as set forth in claim 20, in which said photosensitive cross-linking compound is selected from the group consisting of 1,3-bis(4'-azidobenzal)-2-propane, 1,3-bis(4'-azidobenzal)-2-propane-2'sulfonic acid, 4,4'-diazidostylbene-2,2'-disulfonic acid.

23. A color filter as set forth in claim 20, in which said photosensitive cross-linking compound comprises 4,4'-diazidostylbene-2,2'-disulfonic acid.

24. A color filter as set forth in claim 1, in which said colored filter composition has further contained therein acryl monomers and a photopolymerization initiator.

25. A color filter as set forth in claim 24, in which said acryl monomers comprise bifunctional monomers.

26. A color filter as set forth in claim 25, in which said bifunctional monomers are selected from the group consisting of 1,6-hexanediol diacrylate, ethylene glycol diacrylate, neobenzyl glycol diacrylate, triethylene glycol diacrylate, bis(acryloxy-ethoxy)bisphenol A, and 3-methylpehthanediol diacrylate.

27. A color filter as set forth in claim 24, in which said acryl monomers comprise trifunctional monomers.

28. A color filter as set forth in claim 27, in which said trifunctional monomers are selected from the group consisting of trimethylolpropane acrylate, pentaerythritol triacrylate, and tris(2-hydroxyethyl)isocyanate.

29. A color filter as set forth in claim 24, in which said photopolymerization initiator is selected from the group consisting of acetophenone, benzophenone, benzyldimethylketal, benzoyl peroxide, and 2-chlorothioxyanthone.

30. A color filter as set forth in claim 1, in which said coloring compound comprises a pigment.

31. A color filter as set forth in claim 1, in which said coloring compound comprises an inorganic pigment.

32. A color filter as set forth in claim 31, in which said inorganic pigment is selected from the group consisting of barium sulfate, lead sulfate, zinc flow, titanium oxide, chrome yellow, red iron oxide, ultramarine blue, prussian blue, chromium oxide, carbon black.

33. A color filter as set forth in claim 1, in which said coloring compound comprises an organic pigment.

34. A color filter as set forth in claim 33, in which said organic colorant is selected from the group consisting of azo compounds, phthalocyanine compounds, quinacridone compounds, anthraquinone compounds, perylene, perionone, thioindigo compounds, dioxazine compounds, isoindolenone, quinophthalone and triphenylmethane.

35. A color filter for use in a liquid-crystal display panel structure, comprising
a) a transparent substrate having a surface portion, wherein said substrate is formed of a transparent substance selected from the group consisting of glass and synthetic resin, and
b) a multiplicity of filter elements distributed in a predetermined pattern on said surface portion of said substrate, each of the filter elements being formed of a photo-setting colored filter composition containing an acrylic resin, a coloring compound and a dispersant, wherein said acrylic resin comprises cyclohexyl acrylate structural units expressed by the general formula:

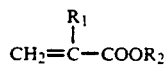

wherein $R_1$ represents a hydrogen atom or a methyl group and $R_2$ represents a cyclohexyl group.

* * * * *